United States Patent
Park et al.

(10) Patent No.: US 12,204,726 B2
(45) Date of Patent: Jan. 21, 2025

(54) DISPLAY DEVICE

(71) Applicant: SAMSUNG DISPLAY CO., LTD., Yongin-si (KR)

(72) Inventors: Yong-Hwan Park, Yongin-si (KR);
Gyung-Min Ko, Yongin-si (KR);
Eunyoung Kim, Yongin-si (KR);
Gyeongnam Bang, Suwon-si (KR);
Seongjun Lee, Suwon-si (KR);
Jeongyun Han, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/308,277

(22) Filed: Apr. 27, 2023

(65) Prior Publication Data

US 2024/0004503 A1 Jan. 4, 2024

(30) Foreign Application Priority Data

Jun. 30, 2022 (KR) .................. 10-2022-0080495

(51) Int. Cl.
*G06F 3/044* (2006.01)
*G06F 3/041* (2006.01)

(52) U.S. Cl.
CPC ........ *G06F 3/0446* (2019.05); *G06F 3/04164* (2019.05); *G06F 2203/04112* (2013.01)

(58) Field of Classification Search
CPC ............... G06F 3/0446; G06F 3/04164; G06F 2203/04112
See application file for complete search history.

(56) References Cited

U.S. PATENT DOCUMENTS

| | | | |
|---|---|---|---|
| 11,449,182 B2 | 9/2022 | Gogte et al. | |
| 2016/0103526 A1* | 4/2016 | Sohn | G06F 3/0446 345/174 |
| 2016/0224181 A1* | 8/2016 | Kim | G06F 3/0446 |
| 2017/0010713 A1* | 1/2017 | Shinoda | G01D 5/2417 |
| 2019/0114006 A1* | 4/2019 | Sakaue | G06F 3/0445 |

(Continued)

FOREIGN PATENT DOCUMENTS

| | | |
|---|---|---|
| KR | 10-2020-0144733 | 12/2020 |
| KR | 10-2021-0056914 | 5/2021 |
| KR | 10-2021-0109694 | 9/2021 |

*Primary Examiner* — Amare Mengistu
*Assistant Examiner* — Jennifer L Zubajlo
(74) *Attorney, Agent, or Firm* — F. Chau & Associates, LLC

(57) ABSTRACT

A display device includes a display panel divided into a display area and a non-display area, and an input sensing unit disposed on the display panel and divided into an active area and a non-active area. The input sensing unit includes a plurality of sensing electrodes overlapping the active area and including a plurality of first sensing electrodes extending in a first direction, and a plurality of second sensing electrodes extending in a second direction crossing the first direction, a plurality of first trace lines respectively connected to the plurality of first sensing electrodes and including an inside portion overlapping the active area, and a dummy electrode unit overlapping the inside portion in the first direction. The dummy electrode unit is adjacent to the plurality of sensing electrodes in the second direction and does not overlap the plurality of sensing electrodes in the first direction.

20 Claims, 18 Drawing Sheets

(56) References Cited

U.S. PATENT DOCUMENTS

| | | |
|---|---|---|
| 2021/0109616 A1* | 4/2021 | Park .................... H10K 59/122 |
| 2021/0271367 A1 | 9/2021 | Park et al. |
| 2021/0286465 A1* | 9/2021 | Jung ................... G06F 3/04164 |
| 2022/0035486 A1* | 2/2022 | Kim ...................... G06F 3/0443 |
| 2023/0119723 A1* | 4/2023 | Lee ..................... G06F 3/04164 |
| | | 345/173 |

* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2022-0080495, filed on Jun. 30, 2022, the disclosure of which is incorporated by reference herein in its entirety.

TECHNICAL FIELD

Embodiments of the present disclosure relate to a display device, and more particularly, to a display device with a reduced dead space and increased sensing performance.

DISCUSSION OF RELATED ART

An electronic apparatus such as, for example, a smartphone, a digital camera, a notebook computer, a navigation device, a smart television or the like, which provides an image to a user, includes a display device that displays an image. The display device may include a display panel which generates and displays an image, and a keyboard, a mouse, or an input sensing unit as an input device.

The input sensing unit, such as a touch panel, is disposed on the display panel and, when touched by a user, generates an input signal. The input signal generated in the touch panel may be provided to the display panel, and the display panel may provide a corresponding image in response to the received input signal.

SUMMARY

Embodiments of the present disclosure provide a display device in which the area of a portion of a trace line included in an input sensing unit, the portion being disposed in a surrounding region, is minimized or reduced, which may reduce a dead space.

Embodiments of the present disclosure provide a display device including an input sensing unit in which a variation of sensitivity between sensing electrodes arranged in a predetermined direction is reduced, which may increase sensing performance.

An embodiment of the inventive concept provides a display device including a display panel divided into a display area and a non-display area, and an input sensing unit disposed on the display panel and divided into an active area overlapping the display area and a non-active area overlapping the non-display area. The input sensing unit includes a plurality of sensing electrodes overlapping the active area and including a plurality of first sensing electrodes extending in a first direction, and a plurality of second sensing electrodes extending in a second direction crossing the first direction, a plurality of first trace lines respectively connected to the plurality of first sensing electrodes and including an inside portion overlapping the active area, and a dummy electrode unit overlapping the inside portion in the first direction. The dummy electrode unit is adjacent to the plurality of sensing electrodes in the second direction and does not overlap the plurality of sensing electrodes in the first direction.

In an embodiment, the active area may have a short side extending in the first direction and a long side extending in the second direction, and the inside portion may overlap a corner part at which the short side is connected to the long side.

In an embodiment, a plurality of first trace lines may include a first side trace line connected to a first side of the plurality of first sensing electrodes, and a second side trace line connected to a second side spaced apart from the first side along the first direction.

In an embodiment, the first side trace line may include a first inside portion overlapping the active area, the second side trace line may include a second side portion overlapping the active area and spaced apart from the first inside portion in the first direction, and the dummy electrode unit may be disposed between the first inside portion and the second inside portion.

In an embodiment, the input sensing unit may include a plurality of second trace lines respectively connected to the plurality of second sensing electrodes and at least partially overlapping the active area, and the dummy electrode unit overlaps a portion of the plurality of second trace lines in the first direction.

In an embodiment, the active area may include a line overlap area in which the inside portion and the portion of the plurality of second trace lines, which overlap the dummy electrode unit in the first direction, are disposed. Some of the plurality of first trace lines and some of the plurality of second trace lines may be disposed in the line overlap area, and a number of the plurality of second trace lines partially disposed in the line overlap area may be smaller than about 30% of a number of the plurality of first trace lines partially disposed in the line overlap area.

In an embodiment, the plurality of second sensing electrodes may include a plurality of unit sensing electrodes arranged along the first direction to which the plurality of second trace lines are connected, and respective widths of the plurality of unit sensing electrodes in the second direction may be substantially identical.

In an embodiment, a cutting part may be defined between the dummy electrode unit and the plurality of unit sensing electrodes.

In an embodiment, the plurality of second sensing electrodes may further include a plurality of main sensing electrodes spaced apart from the plurality of unit sensing electrodes along the second direction, and a width of each of the plurality of main sensing electrodes in the second direction may be larger than that of each of the plurality of unit sensing electrodes in the second direction.

In an embodiment, each of the plurality of sensing electrodes and the dummy electrode unit may include a plurality of mesh lines. Each of the plurality of mesh lines may include a first mesh line extending in a first diagonal direction between the first direction and the second direction, and a second mesh line extending from the first mesh line in a second diagonal direction crossing the first diagonal direction.

In an embodiment, the first mesh line and the second mesh line may cross each other.

In an embodiment, the input sensing unit may include a first sensing insulation layer directly disposed on the display panel, a first sensing conductive layer disposed on the first sensing insulation layer, a second sensing insulation layer disposed on the first sensing insulation layer and covering the first sensing conductive layer, a second sensing conductive layer disposed on the second sensing insulation layer, and a third sensing insulation layer disposed on the second sensing insulation layer and covering the second sensing conductive layer.

In an embodiment, the plurality of first sensing electrodes and the plurality of first trace lines each may be disposed on the second sensing insulation layer.

In an embodiment, the inside portion may include a first portion extending in the first direction and a second portion extending in the second direction.

In an embodiment, the inside portion may include a plurality of mesh lines including a first mesh line extending in a first diagonal direction between the first direction and the second direction, and a second mesh line extending from the first mesh line in a second diagonal direction crossing the first diagonal direction.

In an embodiment, the plurality of mesh lines may include a 1a-th line included in an a-th trace line among the plurality of first trace lines, and a 2a-th line included in the a-th trace line, and spaced apart from the 1a-th line along the first direction and the second direction. The 1a-th line is electrically connected to the 2a-th line through a connection part.

In an embodiment of the inventive concept, a display device includes a display panel divided into a display area and a non-display area, and an input sensing unit disposed on the display panel and divided into an active area overlapping the display area and a non-active area overlapping the non-display area. The input sensing unit includes a plurality of first sensing electrodes overlapping the active area and extending in a first direction, a plurality of second sensing electrodes overlapping the active area and extending in a second direction crossing the first direction, a plurality of first trace lines respectively connected to the plurality of first sensing electrodes and including an inside portion at least partially overlapping the active area, a plurality of second trace lines respectively connected to the plurality of second sensing electrodes and at least partially overlapping the active area, and a dummy electrode unit overlapping the inside portion and some of the plurality of second trace lines in the first direction and spaced apart from the plurality of first sensing electrodes and the plurality of second sensing electrodes along the second direction.

In an embodiment, the active area may include a line overlap area disposed with the inside portion, a main area disposed with the plurality of first sensing electrodes and the plurality of second sensing electrodes, and a dummy area disposed with the dummy electrode unit. The dummy area overlaps the line overlap area in the first direction, and overlaps the main area in the second direction.

In an embodiment, the plurality of second sensing electrodes may include a plurality of unit sensing electrodes arranged along the first direction to which the plurality of second trace lines are connected, and respective widths of the plurality of unit sensing electrodes in the second direction may be substantially identical.

In an embodiment of the inventive concept, a display device includes a display panel divided into a display area and a non-display area, and an input sensing unit disposed on the display panel and divided into an active area overlapping the display area and a non-active area overlapping the non-display area. The input sensing unit includes a plurality of first sensing electrodes overlapping the active area and extending in a first direction, a plurality of second sensing electrodes overlapping the active area and extending in a second direction crossing the first direction, a plurality of first trace lines respectively connected to the plurality of first sensing electrodes, a plurality of second trace lines respectively connected to the plurality of second sensing electrodes, and a dummy electrode unit spaced apart from the plurality of first sensing electrodes and the plurality of second sensing electrodes along the second direction. The plurality of second sensing electrodes include a plurality of unit sensing electrodes connected to the plurality of second trace lines, adjacent to the dummy electrode unit, and arranged along the first direction, and respective widths of the plurality of unit sensing electrodes in the second direction are substantially identical.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1A:
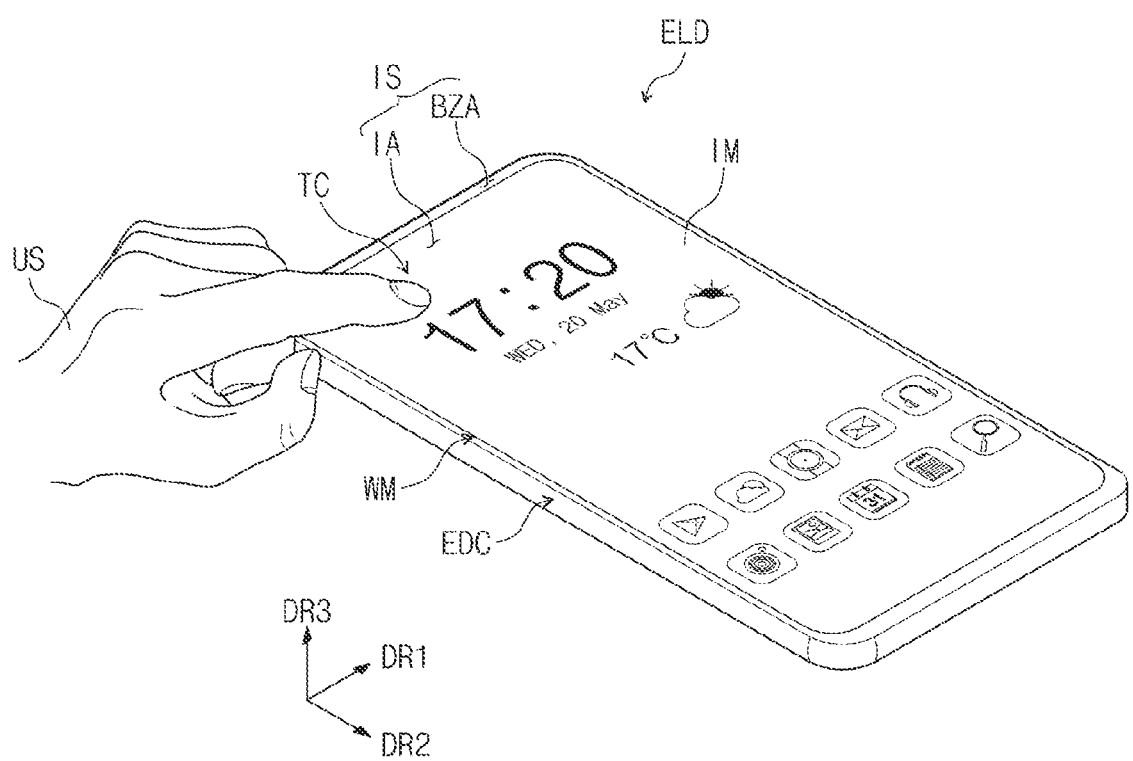
FIG. 1A is a perspective view of an electronic device according to an embodiment of the inventive concept.

Embodiments of the present inventive concept will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or" includes any and all combinations of one or more of the associated items.

It will be understood that the terms "first," "second," "third," etc. are used herein to distinguish one element from another, and the elements are not limited by these terms. Thus, a "first" element in an embodiment may be described as a "second" element in another embodiment. The singular expressions include plural expressions unless the context clearly dictates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

As used herein, the term "being directly disposed" means that there is not an additional layer, film, region, plate or the like disposed between a part of a layer, film, region, plate or the like and another part. For example, "being directly disposed" may mean that disposition of two layers or two members is performed without using an additional member such as an adhesive member therebetween.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 1B:
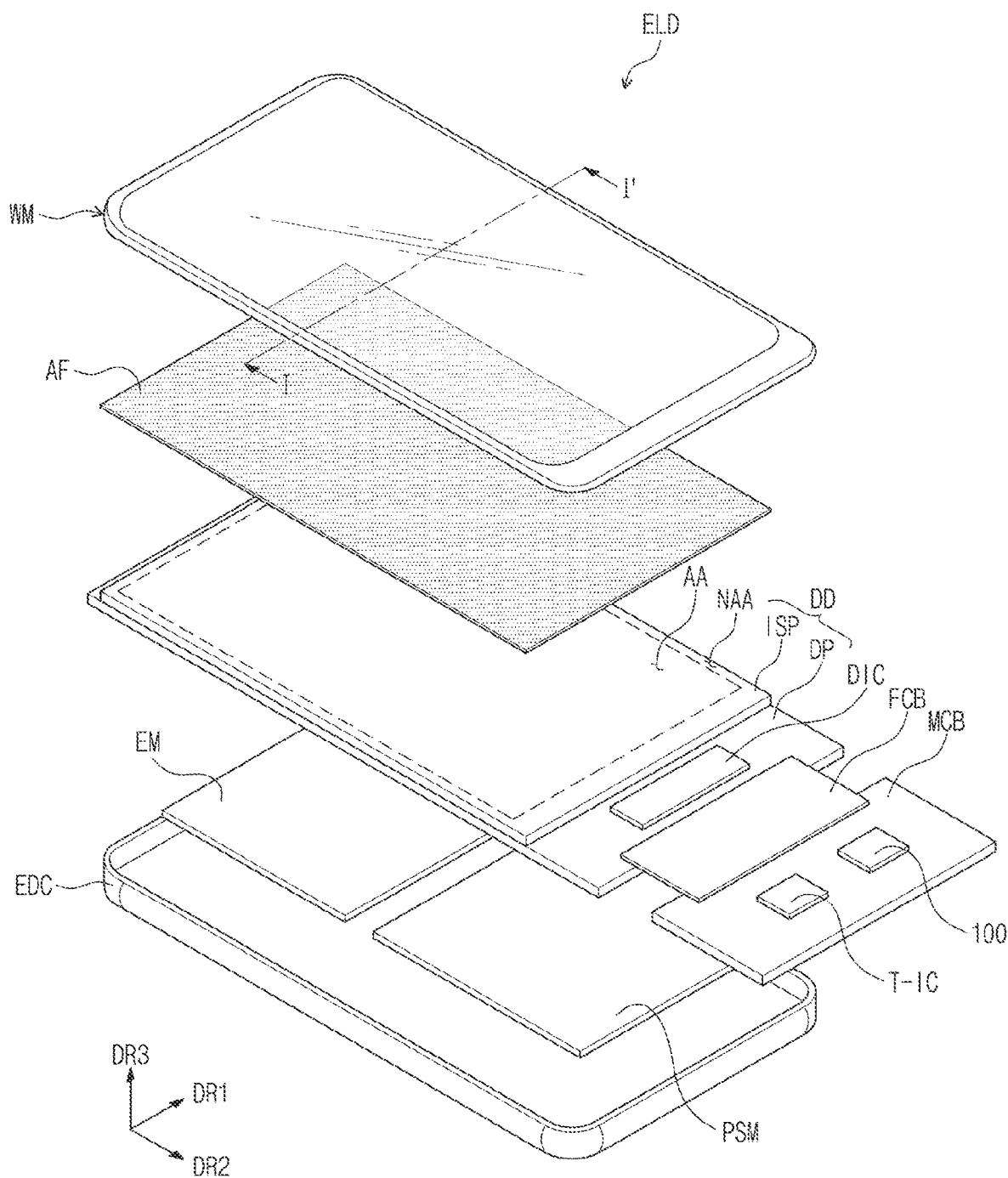
FIG. 1B is an exploded perspective view of an electronic device according to an embodiment of the inventive concept.
Figure 2A:
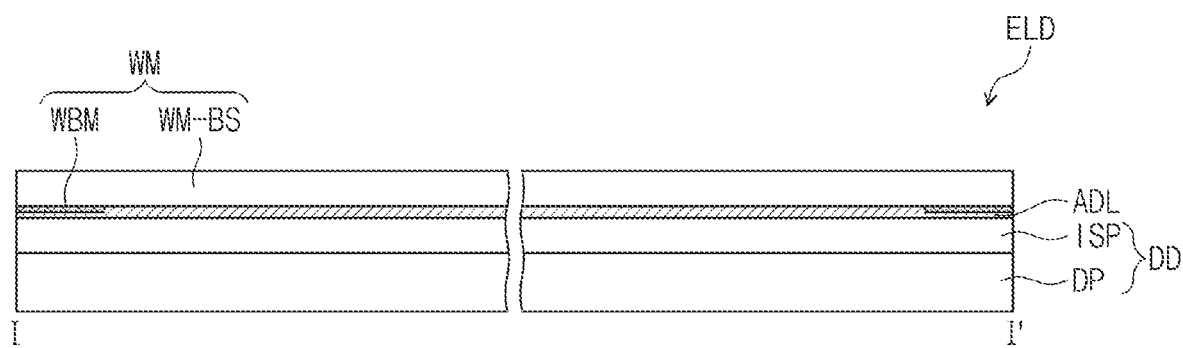
FIGS. 2A and 2B are respective cross-sectional views of an electronic device according to an embodiment of the inventive concept.
Figure 2B:
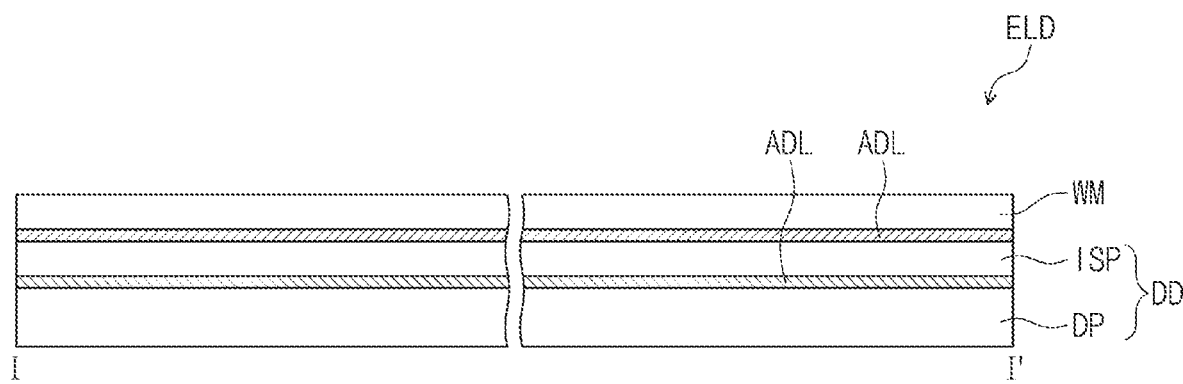
Figure 2C:
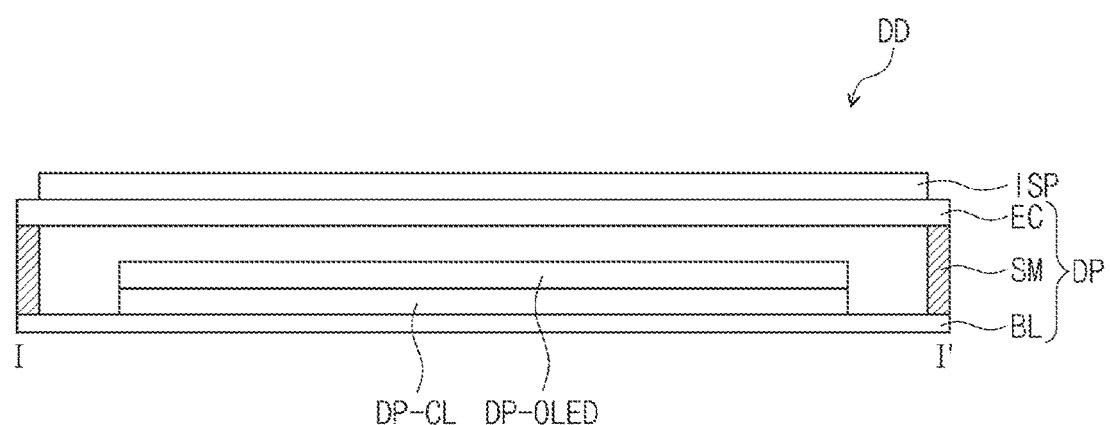
FIGS. 2C and 2D are respective cross-sectional views of a display device according to an embodiment of the inventive concept.
Figure 2D:
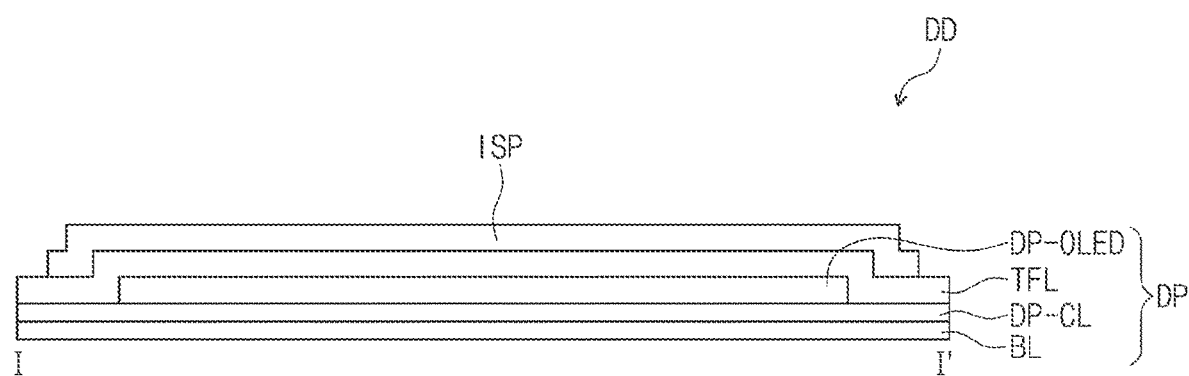

FIG. 1A is a perspective view of an electronic device according to an embodiment of the inventive concept. FIG. 1B is an exploded perspective view of an electronic device according to an embodiment of the inventive concept. FIGS. 2A and 2B are respective cross-sectional views of an electronic device according to an embodiment of the inventive concept. More particularly, FIGS. 2A and 2B are respective cross-sectional views cut along line I-I' shown in FIG. 1B. FIGS. 2C and 2D are respective cross-sectional views of a display device according to an embodiment of the inventive concept. More particularly, FIGS. 2C and 2D are respective cross-sectional views cut along line I-I' shown in FIG. 1B.

Referring to FIGS. 1A and 1B, the electronic device ELD may be a device activated according to an electrical signal. The electronic device ELD may be, for example, a smartphone, a tablet, a notebook computer, or a smart television.

The electronic device ELD may display an image IM on a display screen IS, which is parallel to each of a first direction DR1 and a second direction DR2, toward a third direction DR3. The display surface IS on which the image IM is displayed may correspond to the front surface of the electronic device ELD. The image IM may include a still image as well as a moving image.

According to an embodiment of the inventive concept, on the basis of a direction in which the image IM is displayed, a front surface (or a top surface) and a rear surface (or a bottom surface) of each member are defined. The front surface and the rear surface are opposite to each other in the third direction DR3, and normal directions of the front surface and the rear surface may be parallel to the third direction DR3. Herein, a direction indicated by the third direction DR3 may be referred to as an upward direction, and a direction opposite to the third direction DR3 may be referred to as a downward direction.

The separation distance between the front surface and the rear surface in the third direction DR3 may correspond to the thickness in the third direction DR3 of the electronic device ELD. According to embodiments, directions indicated by the first to third directions DR1, DR2, and DR3 may be differently defined from those defined in FIG. 1A.

The electronic device ELD may detect an external input applied from outside of the electronic device ELD. The external input may include various types of inputs provided from outside of the electronic device ELD. The electronic device ELD according to an embodiment of the inventive concept may sense an input TC applied from outside of the electronic device ELD. The input TC is an input applied by an input means of a passive type, and may be an input by the body of a user US and may include all inputs that may change the electrostatic capacity of an input sensor. The electronic device ELD may also sense the input TC applied by the user US to a side surface or the rear surface of the electronic device ELD according to the structure of the electronic device ELD, but is not limited thereto.

The front surface of the electronic device ELD may include an image area IA and a bezel area BZA. The image area IA may be an area in which the image IM is displayed. The user may visually recognize the image IM through the image area IA. In an embodiment, the image area IA is illustrated in a quadrangular shape with round corners. However, this is an example, and the image area IA may have various shapes and is not limited to any one shape.

The bezel area BZA is adjacent to the image area IA. The bezel area BZA may have a predetermined color. The bezel area BZA may surround the image area IA. Accordingly, the shape of the image area IA may be substantially defined by the bezel area BZA. However, this is an example, and the bezel area BZA is not limited thereto. For example, according to embodiments, the bezel area BZA may be disposed adjacent only to one side of the image area IA, or may be omitted.

As shown in FIG. 1B, the electronic device ELD may include a display device DD, an optical member AF, a window WM, an electronic module EM, a power supply module PSM, and a case EDC. The display device DD generates an image and detects an external input. The display module DD may include a display panel DP and an input sensing unit ISP. The display device DD includes an active area AA and a peripheral area NAA respectively corresponding to the image area IA (see FIG. 1A) and the bezel area BZA (see FIG. 1A) of the electronic device ELD.

The display panel DP is not particularly limited, and may be, for example, an emissive display panel such as an organic light emitting display panel or an inorganic light emitting display panel. A detailed description of the input sensing unit ISP is provided below.

The display device DD may further include a main circuit board MCB, a flexible circuit film FCB, a driving circuit DIC, a sensor control circuit T-IC, and a main controller 100. One or more of these components may be omitted according to embodiments. Each of the driving circuit DIC, the sensor control circuit T-IC, and the main controller 100 may be provided in an integrated chip type. The main circuit board MCB may be connected to the flexible circuit film FCB to be electrically connected to the display panel DP. The main circuit board MCB may include a plurality of driving elements. The main circuit board MCB may be electrically connected to the electronic module EM through a connector.

The flexible circuit film FCB is connected to the display panel DP to connect the display panel DP and the main circuit board MCB. The display panel DP may be bent so that the flexible circuit film FCB and the main circuit board MCB face the rear surface of the display device DD.

In FIG. 1B, the driving circuit DIC mounted on the display panel DP is illustrated as an example, but embodiments are not limited thereto. For example, in an embodiment, the driving circuit DIC may be mounted on the flexible circuit film FCB. The driving chip DIC may include driving elements including, for example, a data driving circuit configured to drive pixels of the display panel DP.

According to embodiments of the inventive concept, the input sensing unit ISP may be electrically connected to the main circuit board MCB through an additional flexible circuit film. However, embodiments of the inventive concept are not limited thereto. The input sensing unit ISP may be electrically connected to the display panel DP, and be electrically connected to the main circuit board MCB through the flexible circuit film FCB.

The optical member AF may reduce the reflection ratio of external light. The optical member AF may include a polarizer and a retarder. The polarizer and the retarder may be stretched or coated. A coated optical film has an optical axis defined along a stretching direction of a functional film. The coated optical film may include liquid-crystal molecules arranged on a base film.

The optical member AF may be omitted in an embodiment of the inventive concept. Here, the display device DD may further include a color filter and a black matrix utilized instead of the optical member AF. The color filter and the black matrix may be directly disposed on the top surface of the input sensing unit ISP through continuous processes. The top surface of the input sensing unit ISP may be provided with an uppermost insulation layer of the input sensing unit ISP.

The window WM provides the external surface of the electronic device ELD. The window WM may include a base substrate, and further include a functional layer such as, for example, an anti-reflection layer or an anti-fingerprint layer.

According to embodiments, the display device DD may further include at least one adhesive layer. The adhesive layer may bond adjacent components of the display device DD. The adhesive layer may be, for example, an optical transparent adhesive layer or a pressure sensitive adhesive layer.

The electronic module EM may include at least a main controller. The electronic module EM may include, for example, a wireless communication module, an image input module, an acoustic input module, an acoustic output module, a memory, an external interface model or the like. The modules may be mounted on the circuit board, or electrically connected through the flexible circuit board. The electronic module EM is electrically connected to the power supply module PSM.

The main controller controls the overall operations of the electronic device ELD. For example, the main controller activates or deactivates the display panel DP in correspondence to a user input. The main controller may control the operations of, for example, the wireless communication module, the image input module, the acoustic input module, the acoustic output module or the like. The main controller may include at least one microprocessor.

The case EDC may be combined with the window WM. The case EDC may absorb an impact applied from outside of the electronic device ELD and may prevent foreign matter/moisture or the like from being permeated into the display device DD, which may protect the components accommodated in the case EDC. Moreover, in an embodiment of the inventive concept, the case EDC may be provided in a type in which a plurality of accommodation members are combined.

Referring to FIG. 2A, the input sensing unit ISP may be directly disposed on the display panel DP. According to an embodiment of the inventive concept, the input sensing unit ISP may be provided on the display panel DP in continuous processes. In other words, when the input sensing unit ISP is directly disposed on the display panel DP, an adhesive film is not disposed between the input sensing unit ISP and the display panel DP. However, as shown in FIG. 2B, the adhesive layer ADL may be disposed between the input sensing unit ISP and the display panel DP in an embodiment. In this case, the input sensing unit ISP is not manufactured in the continuous processes with the display panel DP, and may be fixed on the top surface of the display panel DP by the adhesive film after being manufactured through a separate process from the display panel DP. In FIGS. 2A and 2B, for convenience of illustration, the optical member AF shown in FIG. 1B is not shown. In addition, for convenience of illustration, the component disposed in a lower side of the display device DD is also not shown.

As shown in FIG. 2A, the window WM may include a light shielding pattern WBM for defining the bezel area BZA (see FIG. 1A). The light shielding pattern WBM is a colored organic film, and may be provided on one surface of the base layer WM-BS in a coating manner.

As shown in FIG. 2C, the display panel DP includes a base layer BL, a circuit element layer DP-CL disposed on the base layer BL, a display element layer DP-OLED, an encapsulation substrate EC, and a sealant SM configured to bond the base layer BL and the encapsulation substrate EC.

The base layer BL may include at least one plastic film. The base layer BL may include, for example, a plastic substrate, a glass substrate, a metal substrate, an organic/inorganic composite material substrate or the like. The base layer BL in an embodiment may be a thin-film glass substrate having the thickness of tens to hundreds micrometers. The base layer BL may have a multilayer structure. For example, an organic layer (e.g., polyimide layer)/at least one inorganic layer/an organic layer (e.g., polyimide layer) may be included.

The circuit element layer DP-CL may include at least one insulation layer and a circuit element. The insulation layer may include at least one inorganic layer and at least one organic layer. The circuit element may include signal lines, a pixel circuit or the like. A detailed description thereof is provided below.

The display element layer DP-OLED may include at least a light emitting element. The display element layer DP-OLED may further include an organic layer such as a pixel definition layer.

The encapsulation substrate EC may be spaced apart from the display element layer DP-OLED with a predetermined gap GP interposed therebetween. The base layer BL and the encapsulation substrate EC may include, for example, a plastic substrate, a glass substrate, a metal substrate, an organic/inorganic composite material substrate or the like. The sealant SM may include, for example, an organic adhesive, a frit or the like. The gap GP may be filled with a predetermined material. A moisture absorbent or a resin material may fill the gap GP.

As shown in FIG. 2D, the display panel DP includes a base layer BL, a circuit element layer DP-CL disposed on the base layer BL, a display element layer DP-OLED, and a top insulation layer TFL. The top insulation layer TFL includes a plurality of thin films. The top insulation layer TFL may include a protection layer, which may protect the light emitting element. The top insulation layer TFL may include a thin-film encapsulation layer including at least one inorganic layer/an organic layer/an inorganic layer. The thin-film encapsulation layer may be disposed on the protection layer.

Figure 3:
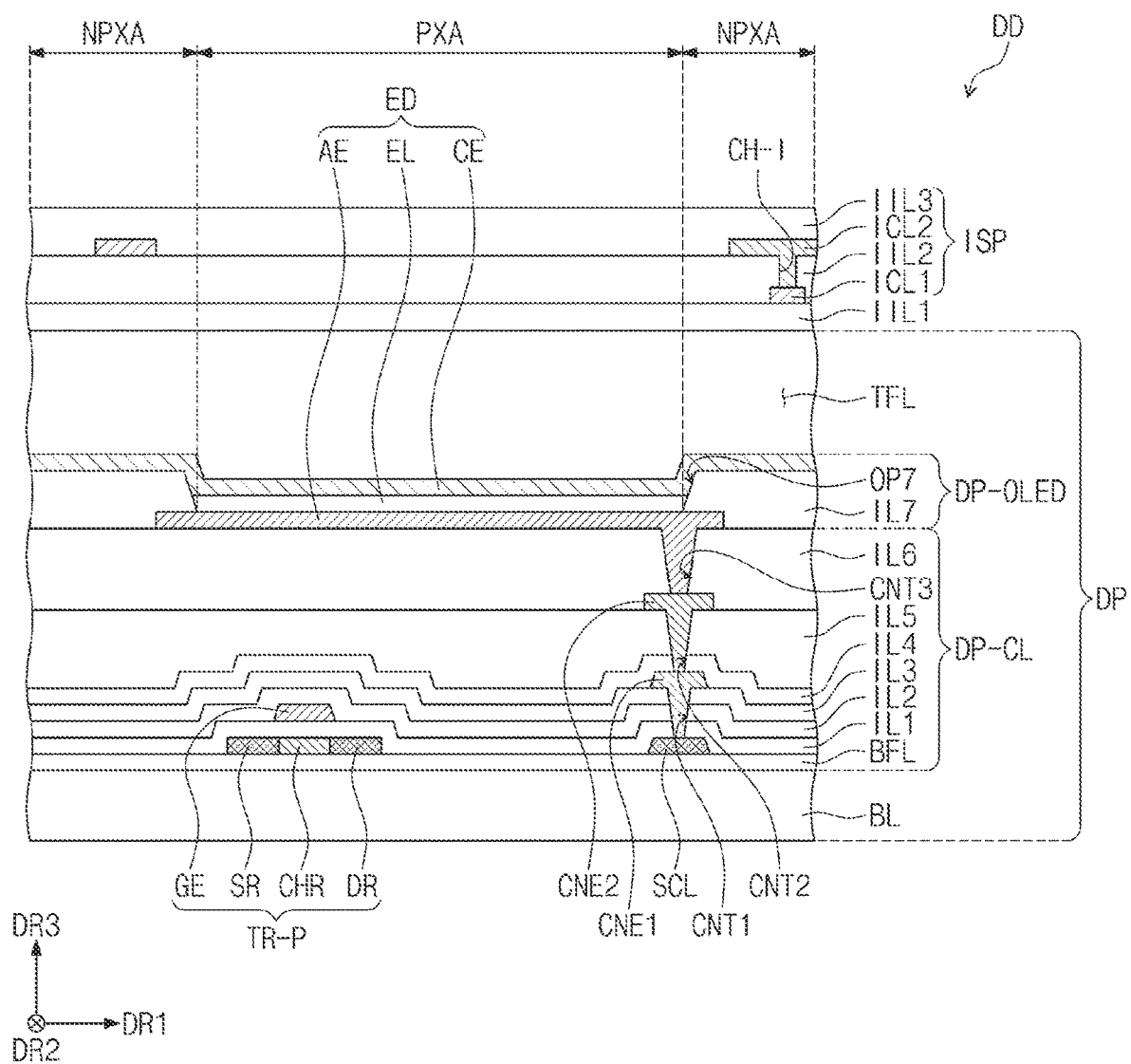
FIG. 3 is an enlarged cross-sectional view of a display device according to an embodiment of the inventive concept.

FIG. 3 is an enlarged cross-sectional view of a display device according to an embodiment of the inventive concept. FIG. 3 is shown on the basis of the display device of FIG. 2D.

Referring to FIG. 3, the display device DD may include the display panel DP and the input sensing unit ISP directly disposed on the display panel DP. The display panel DP may include the base layer BL, the circuit element layer DP-CL, the display element layer DP-OLED, and the top insulation layer TFL.

The display device DD may include the active area AA and the peripheral area NAA described with reference to FIG. 1B. Each of the display panel DP and the input sensing unit ISP may include areas respectively corresponding to the active area AA and the peripheral area NAA of the display device DD. In FIG. 3, a portion of the active area AA is shown as enlarged.

The base layer BL may provide a base surface with the circuit element layer DP-CL disposed thereon. The circuit element layer DP-CL may be disposed on the base layer BL. The circuit element layer DP-CL may include, for example, an insulation layer, a semiconductor pattern, a conductive pattern, signal lines and the like. The insulation layer, the semiconductor layer, and the conductive layer may be provided on the base layer BL in a manner of, for example, coating, deposition or the like, and then, the insulation layer, the semiconductor layer, and the conductive layer may be selectively patterned through a plurality of times of photolithography process. Then, the semiconductor pattern, the conductive pattern, and the signal lines included in the circuit element layer DP-CL may be provided.

At least one inorganic layer is provided on the top surface of the base layer BL. In an embodiment, the display layer DP is illustrated to include a buffer layer BFL. The buffer layer BFL may increase the bonding force between the base layer BL and the semiconductor pattern. The buffer layer BFL may include, for example, silicon oxide layers and silicon nitride layers, and the silicon oxide layers and the silicon nitride layers may be alternately laminated.

The semiconductor pattern may be disposed on the buffer layer BFL. The semiconductor pattern may include polysilicon. However, embodiments of the inventive concept are not limited thereto. For example, the semiconductor pattern may include amorphous silicon or metal oxides according to embodiments.

For convenience of illustration, FIG. 3 merely illustrates a portion of the semiconductor pattern. According to embodiments, another semiconductor pattern may be further disposed in another area. The semiconductor pattern may be arranged according to a specific rule across pixels. The semiconductor pattern has different properties according to whether or not the pattern is doped. The semiconductor pattern may include a first area having high conductivity and a second area having low conductivity. The first area may be doped with an N-type dopant or a P-type dopant. A P-type transistor includes a doped area doped with a P-type dopant. The second area may be a non-doped area, or be doped at a lower concentration in comparison to the first area.

The first area may have a greater conductivity than the second area, and substantially operate as an electrode or a signal line. The second area may substantially correspond to an active area (or a channel area) of the pixel transistor TR-P. In other words, a portion of the semiconductor pattern may be an active area of the transistor, and another portion may be a source area or a drain area of the transistor.

Each of the pixels may have an equivalent circuit including seven transistors, one capacitor, and a light emitting element, and the components included in the equivalent circuit of the pixel may vary. In FIG. 3, one transistor TR-P and a light emitting element ED included in a pixel are illustrated as an example.

A source region SR, a channel region CHR, and a drain region DR of the pixel transistor TR-P may be provided from the semiconductor pattern. The source region SR and the drain region DR may extend in opposite directions from each other from the channel region CHR in the cross-section. FIG. 3 also illustrates a portion of a signal transfer region SCL provided from a first region of the semiconductor pattern. According to embodiments, the signal transfer region SCL may be electrically connected to the pixel transistor in a plan view.

The first insulation layer IL1 may be disposed on the buffer BFL. The first insulation layer IL1 may commonly overlap the plurality of pixels and cover the semiconductor pattern. The first insulation layer IL1 may include, for example, an inorganic material and/or organic material, and have a single layer or multilayer structure. The first insulation layer IL1 may include at least one of, for example, aluminum oxide, titanium oxide, silicon oxide, silicon nitride, silicon oxynitride, zirconium oxide, or hafnium oxide. In an embodiment, the first insulation layer IL1 may be a silicon oxide layer of a single layer of silicon oxide. The first insulation layer IL1, as well as an insulation layer of the circuit element layer DP-CL to be described below, may include an inorganic layer and/or an organic layer, and have a single layer or multilayer structure. The inorganic material layer may include at least one of the aforementioned materials, but is not limited thereto.

The gate GE of the pixel transistor TR-P may be disposed on the first insulation layer IL1. The gate GE may be a portion of a metal pattern. The gate GE may overlap the channel region CHR. The gate GE may function as a mask in a process of doping the semiconductor pattern.

The second insulation layer IL2 may be disposed on the first insulation layer IL1 and cover the gate GE. The second insulation layer IL2 may commonly overlap the pixels. The second insulation layer IL2 may include, for example, an inorganic layer and/or organic layer, and have a single layer or multilayer structure. In an embodiment, the second insulation layer IL2 may be a single layer of silicon oxide.

A third insulation layer IL3 may be arranged on the second insulation layer IL2. According to an embodiment, the third insulation layer IL3 may be a single layer of silicon oxide. A first connection electrode CNE1 may be disposed on the third insulation layer IL3. The first connection electrode CNE1 may be connected to the signal transfer region SCL through a contact hole CNT1 penetrating through the first to third insulation layers IL1, IL2, and IL3.

A fourth insulation layer IL4 may be disposed on the third insulation layer IL3. The fourth insulation layer IL4 may be a single layer of silicon oxide. A fifth insulation layer IL5 may be disposed on the fourth insulation layer IL4. The fifth insulation layer IL5 may be an organic layer. According to embodiments, the fourth insulation layer IL4 may be omitted, and the fifth insulation layer IL5 may be disposed on the third insulation layer IL3.

A second connection electrode CNE2 may be disposed on the fifth insulation layer IL5. The second connection electrode CNE2 may be connected to the first connection electrode CNE1 through a contact hole CNT2 penetrating through the fourth insulation layer IL4 and the fifth insulation layer IL5.

A sixth insulation layer IL6 may be disposed on the fifth insulation layer IL5 and cover the second connection electrode CNE2. The sixth insulation layer IL6 may be an organic layer. The display element layer DP-OLED may be disposed on the circuit element layer DP-CL. The display element layer DP-OLED may include the light emitting element ED. The light emitting element ED may include a first electrode AE, a light emitting layer EL, and a second electrode CE. For example, the light emitting layer EL may include an organic emission material, a quantum dot, a quantum rod, a micro LED, or a nano-LED.

A first electrode AE may be disposed on the sixth insulation layer IL6. The first electrode AE is connected to the second connection electrode CNE2 through a contact hole CNT3 penetrating through the sixth insulation layer IL6.

A pixel definition layer IL7 may be disposed on the sixth insulation layer IL6 and cover a portion of the first AE. The pixel definition layer IL7 is defined with an opening OP7. The opening OP7 of the pixel definition layer IL7 exposes at least a portion of the first AE. In an embodiment, a light emitting area PXA is defined to correspond to the portion of the first electrode AE exposed by the opening OP7. A non-light emitting area NPXA may surround the light emitting area PXA.

The light emitting layer EL may be disposed on the first electrode AE. The light emitting layer EL may be disposed to correspond to the opening OP7. In other words, the light emitting layer EL may be divided and provided in each of the plurality of pixels. When the light emitting layer EL is divided and provided in each of the pixels, each of the divided light emitting layers EL may emit light of at least one of blue, red, or green. However, embodiments of the inventive concept are not limited thereto. For example, according to embodiments, the light emitting layer EL may be connected and commonly provided to the pixels. In this case, the light emitting layer EL may provide blue light, or white light.

The second electrode CE may be disposed on the light emitting layer EL. The second electrode CE may have an integral shape, and be commonly disposed in the plurality of pixels. The second electrode CE may be provided with a common voltage, and be referred to as a common electrode.

According to embodiments, the first electrode AE and the light emitting layer EL may have a hole control layer interposed therebetween. The hole control layer may be commonly disposed in the light emitting area PXA and the non-light emitting area NPXA. The hole control layer HCL may include a hole transport layer, and further include a hole injection layer. The light emitting layer EL and the second electrode CE may have an electron control layer interposed therebetween. The electron control layer may include an electron transport layer, and further include an electron injection layer. The hole control layer and the electron control layer may be commonly provided in the plurality of pixels using an open mask.

The input sensing unit ISP may be directly provided on the top surface of the top insulation layer TFL through the continuous processes. The input sensing unit ISP may include a first sensing insulation layer IIL1, a first sensing conductive layer ICL1, a second sensing insulation layer IIL2, a second sensing conductive layer ICL2, and a third sensing insulation layer IIL3. In an embodiment of the inventive concept, the first sensing insulation layer IIL1 may be omitted.

Each of the first sensing conductive layer ICL1 and the second sensing conductive layer ICL2 may have a single layer structure or a multilayer structure having a plurality of patterns laminated along the third direction DR3. The conductive layer of the single layer structure may include a metal layer or a transparent conductive layer. The metal layer may include, for example, molybdenum, silver, titanium, copper, aluminum, or an alloy thereof. The transparent conductive layer may include a transparent conductive oxide such as, for example, indium tin oxide (ITO), indium zinc oxide (IZO), zinc oxide (ZnO), indium zinc tin oxide (IZTO) or the like. The transparent conductive layer may include a conductive polymer such as, for example, PEDOT, a metal nano-wire, graphene or the like.

The conductive layer of the multilayer structure may include metal layers. For example, the metal layers may have a three-layer structure of titanium/aluminum/titanium. The conductive layer of the multilayer structure may include at least one metal layer and at least one transparent conductive layer.

The second sensing insulation layer IIL2 covers the first sensing conductive layer ICL1, and the third sensing insulation layer IIL3 cover the second sensing conductive layer ICL2. Although each of the first sensing insulation layer IIL1 to the third sensing insulation layer IIL3 is shown as a single layer, embodiments are not limited thereto.

At least one of the first sensing insulation layer IIL1 and the second sensing insulation layer IIL2 may include an inorganic film. The inorganic film may include at least one of, for example, aluminum oxide, titanium oxide, silicon oxide, silicon nitride, silicon oxynitride, zirconium oxide, or hafnium oxide.

At least one of the second sensing insulation layer IIL2 and the third sensing insulation layer IIL3 may include an organic film. The organic film may include at least one of, for example, an acrylic-based resin, a meta-acrylic-based resin, polyisoprene, a vinyl-based resin, an epoxy-based resin, a urethane-based resin, a cellulose-based resin, a siloxane-based resin, a polyimide based-resin, a polyamide-resin, or a perylene-based resin.

Figure 4A:
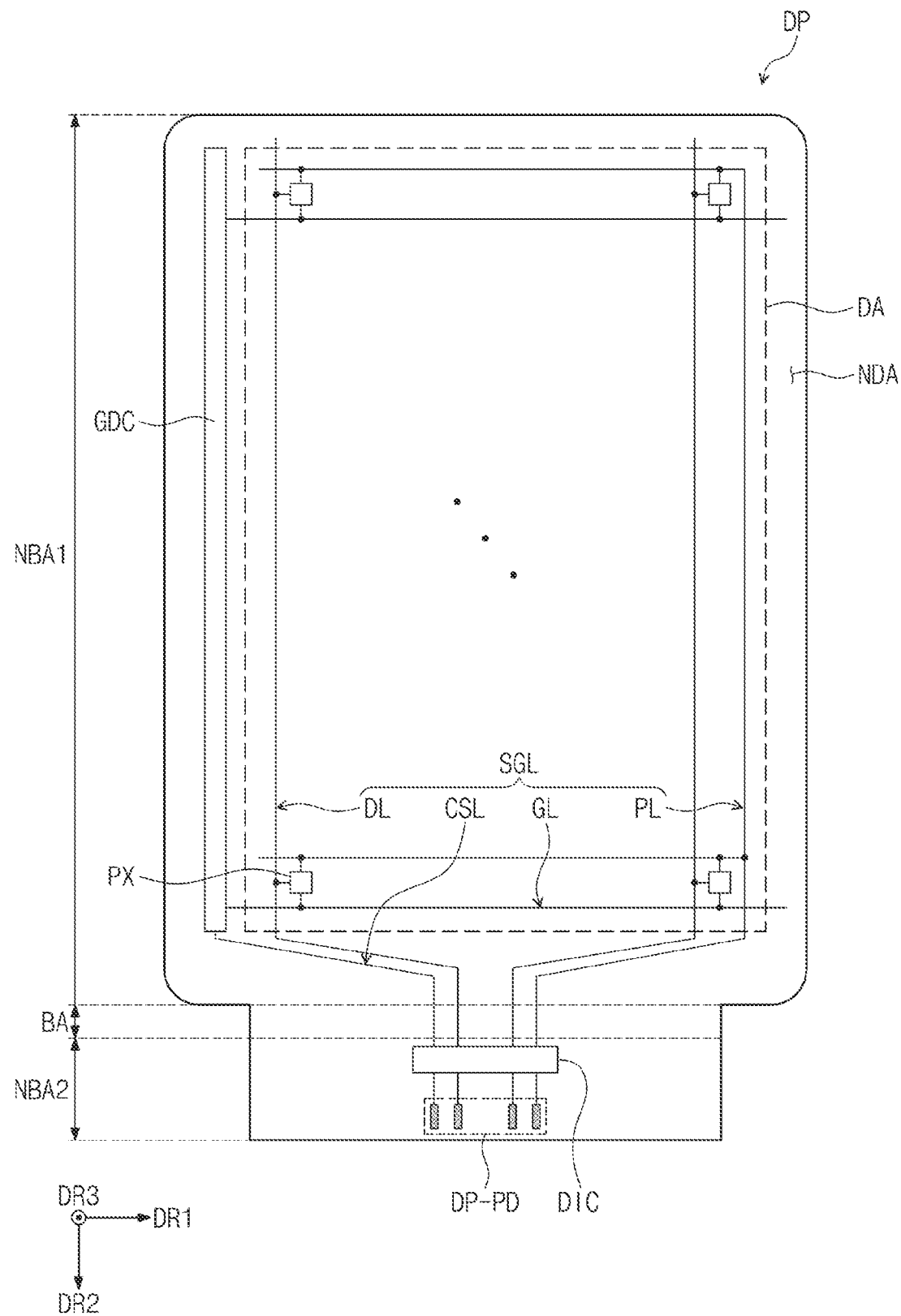
FIG. 4A is a plan view of a display panel according to an embodiment of the inventive concept.
Figure 4B:
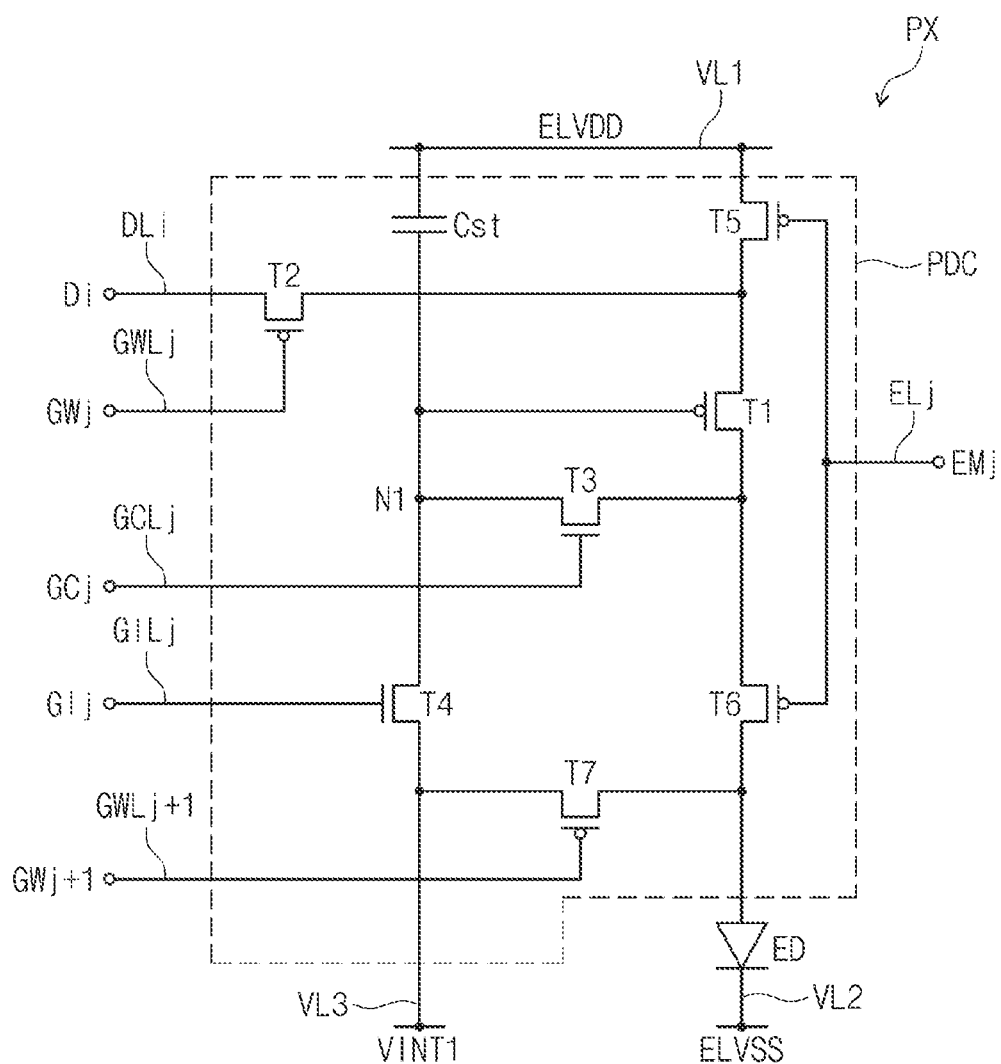
FIG. 4B is a circuit diagram of a pixel according to an embodiment of the inventive concept.

FIG. 4A is a plan view of a display panel according to an embodiment of the inventive concept. FIG. 4B is a circuit diagram showing a pixel according to an embodiment of the inventive concept.

Referring to FIG. 4A, the display panel DP may be divided into a display area DA and a non-display area NDA in a plan view. The display area DA of the display panel DP is an area in which an image is displayed, and the non-display area NDA may be an area in which a driving circuit, a driving wiring or the like is disposed. In the display area DA, light emitting elements of the plurality of respective pixels PX may be disposed. The display area DA may overlap at least a portion of the image area IA (see FIG. 1A) of the electronic device ELD (see FIG. 1A), and the non-display area NDA may be covered with the bezel area BZA (see FIG. 1A) of the electronic device. The display area DA and the non-display area NDA of the display panel DP may respectively correspond to the active area AA and the peripheral area NAA of the display device DD shown in FIG. 1B.

According to an embodiment, the display panel DP may include a plurality of pixels PX (hereinafter, pixels), a plurality of signal lines SGL, a scan driving circuit GDC, a data driving circuit DIC, and a display pad unit DP-PD.

Each of the pixels PX may include a light emitting element and a plurality of transistors connected thereto. The pixels PX may emit light in correspondence to an electrical signal applied thereto.

The signal lines SGL include scan lines GL, data lines DL, a power line PL, and a control signal line CSL. The scan lines GL may be respectively connected to corresponding pixels among the pixels PX. The data lines DL may be respectively connected to corresponding pixels among the pixels PX. The power line PL may be connected to the pixels PX to provide a power supply voltage thereto. The control signal line CSL may provide control signals to the scan driving circuit GDC.

The scan driving circuit GDC may be disposed in the non-display area NDA. The scan driving circuit GDC may generate scan signals and sequentially output the scan signals to the scan lines GL. The scan driving circuit GDC may further output another control signal to the driving circuit of the pixels PX.

The scan driving circuit GDC may include a plurality of thin-film transistors provided through the same process as the driving circuit of the plurality of pixels, for example, a Low Temperature Polycrystalline Silicon (LTPS) process or a Low Temperature Polycrystalline Oxide process (LTPO) process.

In the display panel DP according to an embodiment, a portion of the display panel DP may be bent. The display panel DP may include a first non-bending area NBA1, a second non-bending area NBA2 spaced apart from the first non-bending area NBA1 in the first direction DR1, and a bending area BA defined between the first non-bending area NBA1 and the second non-bending area NBA2. The first non-bending area NBA1 may include the display area DA and a portion of the non-display area NDA. The non-display area NDA may include the bending area BA and the second non-bending area NBA2.

The bending area BA may be bent along a virtual axis extending in the first direction DR1. When the bending area BA is bent, the second area NBA2 may face the first non-bending area NBA1. According to embodiments, the width of the first non-bending area NBA1 in the first direction DR1 may be smaller than that of the bending area BA in the first direction DR1 in the display panel DP.

The display pad unit DP-PD may be disposed adjacent to the end of the second non-bending area NBA2. The signal lines SGL may extend from the first non-bending area NBA1 to the second non-bending area NBA2 via the bending area BA to be connected to the display pad unit DP-PD. The display pad unit DP-PD may be electrically connected to the flexible circuit film FCB (see FIG. 1B). As the flexible circuit film FCB (see FIG. 1B) is attached to the display panel unit DP-PD through a conductive adhesive film or the like, the display panel DP may be electrically connected to the flexible circuit film FCB (see FIG. 1B). According to embodiments, the driving circuit DIC may be mounted on the display panel DP, and include the data driving circuit.

FIG. 4B illustrates an example of an equivalent circuit of one pixel among the plurality of pixels PX shown in FIG. 4A. Each of the plurality of pixels PX may have the same circuit structure.

Referring to FIG. 4B, the pixel PX is connected to an i-th data line DLi among the data lines DL1 to DLm, a j-th initialization scan line GILj among initialization scan lines GIL1 to GILn, a j-th compensation scan line GCLj among compensation scan lines GCL1 to GCLn, a j-th write scan line GWLj and a (j+1)-th write scan line GWLj+1 among write scan lines GWL1 to GWLn, and a j-th emission control line ELj among emission control lines EL1 to ELn, where each of i, m and j is a positive integer.

The pixel PX may include a light emitting element ED and a pixel driving circuit PDC. The light emitting element ED may include a light emitting diode. In an embodiment, the light emitting element ED may be an organic light emitting diode including an organic light emitting layer.

The pixel driving circuit PDC may include first to seventh transistors T1 to T7 and one storage capacitor Cst. The first to seventh transistor T1 to T7 may be respectively referred to as a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Some of the first to seventh transistors T1 to T7 may be P-type transistors, and the others may be N-type transistors. For example, in an embodiment, the first, second, fifth, sixth and seventh transistors T1, T2, T5, T6, and T7 may be PMOS transistors, and the third and fourth transistors T3 and T4 may be NMOS transistors.

At least one of the first to seventh transistors T1 to T7 may be a transistor having an LTPS semiconductor layer, and at least one of the first to seventh transistors T1 to T7 may be a transistor having an oxide semiconductor layer.

For example, in an embodiment, the first transistor T1, which may directly affect the brightness of the display device, includes a semiconductor layer composed of high reliable polycrystalline silicon, which may result in implementation of a display device with high resolution.

According to embodiments, the oxide semiconductor has a high carrier mobility and a low leakage current, and thus, a voltage drop is not large, even despite a long driving time.

In other words, according to embodiments, a change in color of an image according to the voltage drop is not large even during low frequency driving, and thus, low frequency driving may be implemented. In this way, since the oxide semiconductor typically has a small leak current, at least one of the third transistor, which is connected to a driving gate electrode of the first transistor T1, and the fourth transistor T4, may adopt the oxide semiconductor, which may prevent or reduce leak current which may flow to the driving gate electrode, which may thereby reduce power consumption.

The first, second, fifth, sixth, and seventh transistors T1, T2, T5, T6, and T7 may be transistors having LTPS transistors, and the third and fourth transistors T3 and T4 may be transistors having the oxide semiconductor.

The configuration of the pixel driving circuit PDC according to an embodiment of the inventive concept is not limited to the configuration shown in FIG. 4B. For example, the pixel driving circuit PDC shown in FIG. 4B is merely an example, and the configuration of the pixel driving circuit PDC may be modified according to embodiments. For example, all the first to seventh transistors T1 to T7 may be P-type transistors, or N-type transistors according to an embodiment.

The j-th initialization scan line GILj, the j-th compensation scan line GCLj, the j-th write scan line GWLj, the (j+1)-th write scan line GWLj+1, and the j-th emission control line ELj may transfer a j-th initialization scan signal GIj, a j-th compensation scan signal GCj, a j-th write scan signal GWj, a (j+1)-th write scan signal GWj+1, and a j-th emission control signal ELj to the pixel respectively. The i-th data line DLi transfers an i-th data signal Di to the pixel PX. The i-th data signal Di may have a voltage level corresponding to the input image signal RGB input to the display device DD.

A first driving voltage line VL1 and a second driving voltage line VL2 may respectively transfer the first driving voltage ELVDD and the second driving voltage ELVSS to the pixel PX. In addition, a first initialization voltage line VL3 may transfer a first initialization voltage VINT1 to the pixel PX.

The first transistor T1 is connected between the first driving voltage line VL1 configured to receive the first driving voltage and the light emitting element ED. The first transistor T1 includes a first electrode connected to the first driving voltage line VL1 via the fifth transistor T5, a second electrode electrically connected to an anode of the light emitting element ED via the sixth transistor T6, and a third electrode connected to one end of the storage capacitor Cst. The first transistor T1 may receive the i-th data signal Di transferred by the i-th data line DLi according to a switching operation of the second transistor T2, and provide a driving current to the light emitting element ED.

The second transistor T2 is connected between the data line DLi and the first electrode of the first transistor T1. The second transistor T2 includes a first electrode connected to the data line DLi, a second electrode connected to the first electrode of the first transistor Ti, and a third electrode connected to the j-th write scan line GWLj. The second transistor T2 may be turned on in response to the write scan signal GWj transferred through the j-th write scan line GWLj to deliver, to the first electrode of the first transistor T1, the i-th data signal Di transferred from the i-th data line DLi.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode connected to the j-th compensation scan line GCLj. The third transistor T3 may be turned on in response to the j-th compensation scan signal GCj transferred through the j-th compensation scan line GCLj to connect the third electrode and the second electrode of the first transistor T1, and thus, the first transistor T1 may be diode-connected.

The fourth transistor T4 is connected between the first initialization voltage line VL3 to which the first initialization voltage VINT1 is applied and the first node N1. The fourth transistor T4 includes a first electrode connected to the third electrode of the first transistor T1, a second electrode connected to the first initialization voltage line VL3 to which the first initialization voltage VINT1 is transferred, and a third electrode connected to the j-th initialization scan line GILj. The fourth transistor T4 is turned on in response to the j-th initialization scan signal GIj transferred through the j-th initialization scan line GILj. The turned-on fourth transistor T4 transfers the first initialization voltage VINT1 to the third electrode of the first transistor T1 to initialize the potential at the third electrode of the first transistor T1 (e.g., the potential of the first node N1).

The fifth transistor T5 includes a first electrode connected to the first driving voltage line VL1, a second electrode connected to the first electrode of the first transistor Ti, and a third electrode connected to the j-th emission control line ELj.

The sixth transistor T6 includes a first electrode connected to the second electrode of the first transistor T1, a second electrode connected to the anode of the light emitting element ED, and a third electrode connected to the j-th emission control line ELj.

The fifth and sixth transistors T5 and T6 may be substantially simultaneously turned on in response to the j-th emission control signal EMj transferred through the j-th emission control line ELj. The first driving voltage ELVDD applied through the turned-on fifth transistor T5 may be compensated by the diode-connected first transistor T1 and then transferred to the light emitting element ED.

The seventh transistor T7 includes a first electrode connected to the first initialization line VL3 to which the first initialization voltage VINT1 is applied, a second electrode connected to the second electrode of the sixth transistor T6, and a third electrode connected to the (j+1)-th write scan line (GWLj+1). According to embodiments of the inventive concept, the first initialization voltage VINT1 may have a negative electrostatic voltage. For example, the first initialization voltage VINT1 may be about −3.5 V, but is not particularly limited thereto.

As described above, one end of the storage capacitor Cst is connected to the third electrode of the first transistor T1, and the other end of the storage capacitor Cst is connected to the first driving voltage line VL1. A cathode of the light emitting element ED may be connected to the second driving voltage line VL2 configured to transfer the second driving voltage ELVSS. The second driving voltage ELVSS may have a lower level than the first driving voltage ELVDD. According to embodiments of the inventive concept, the second driving voltage ELVSS may have a lower level than the first initialization voltage VINT1.

Figure 5A:
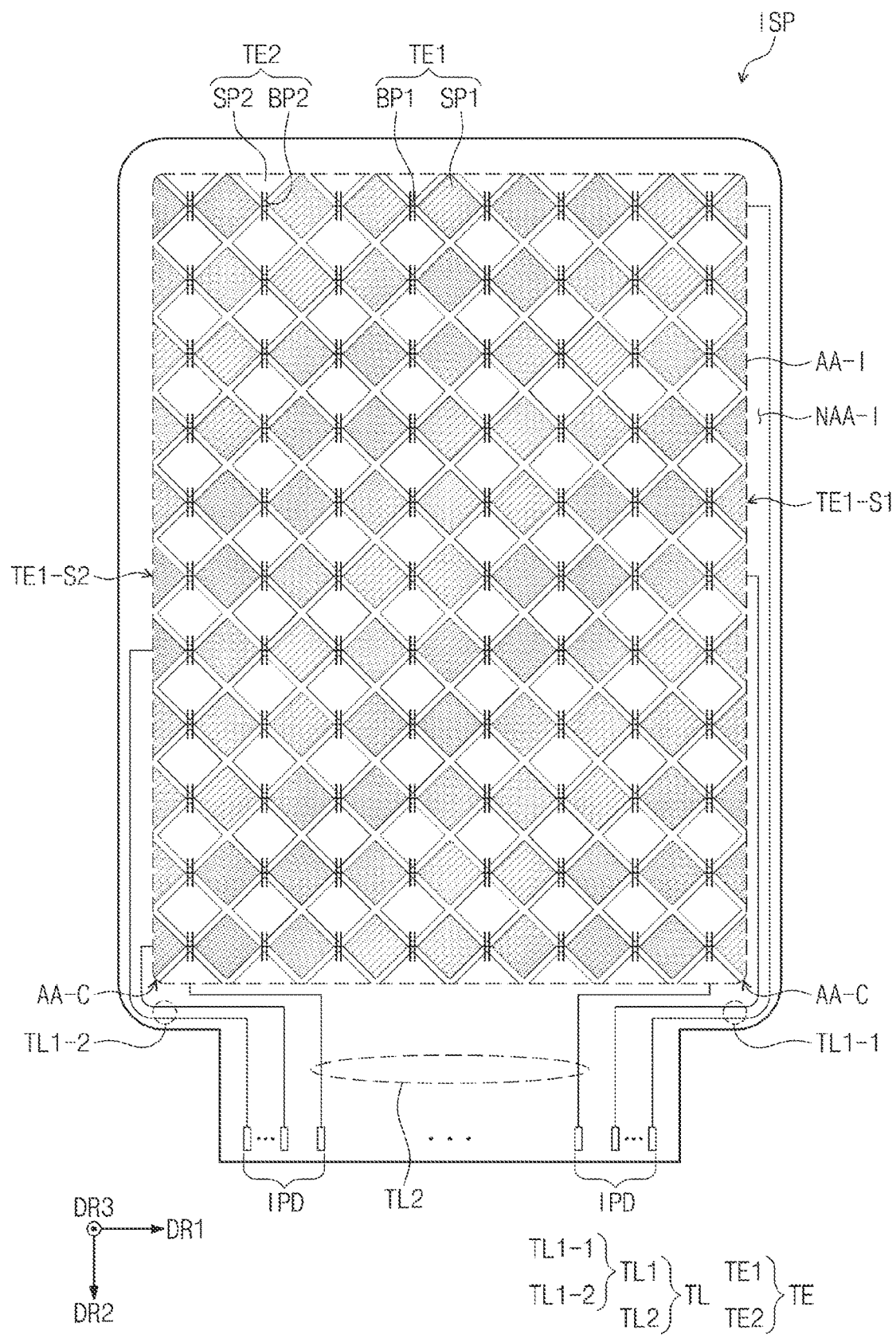
FIG. 5A is a plan view of an input sensing unit according to an embodiment of the inventive concept.
Figure 5B:
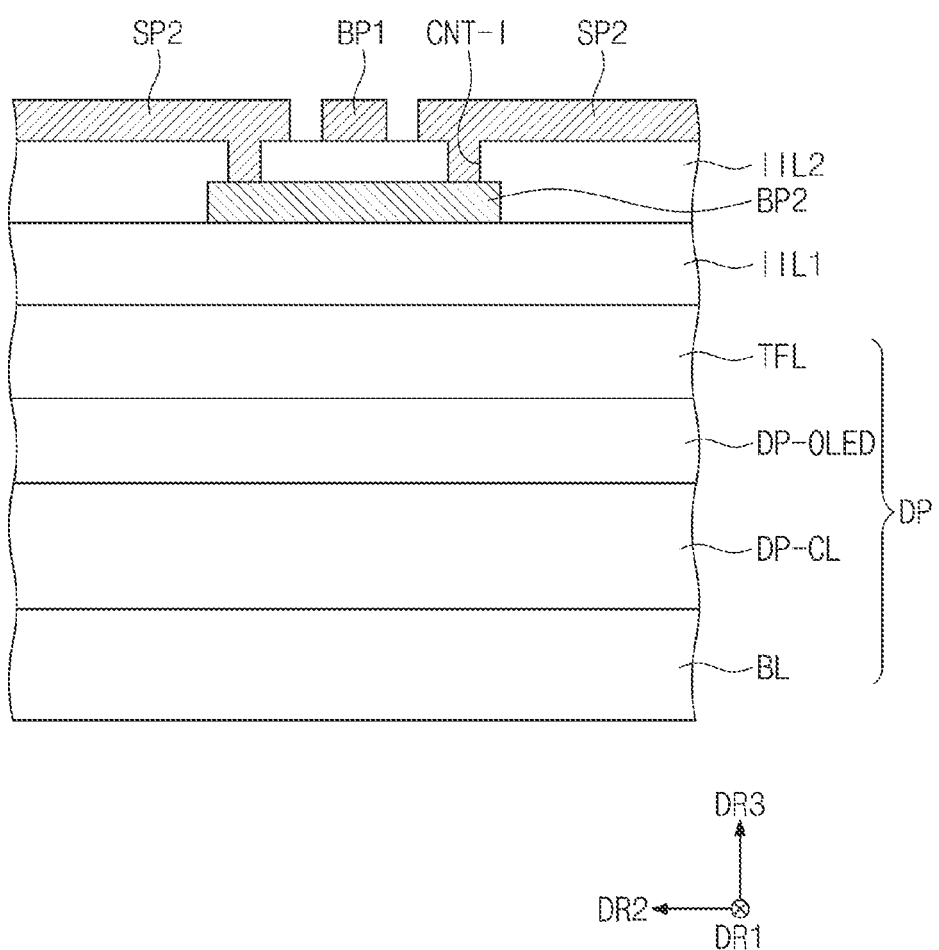
FIGS. 5B and 5C are respective cross-sectional views of a portion of an input sensing unit according to an embodiment of the inventive concept.
Figure 5C:
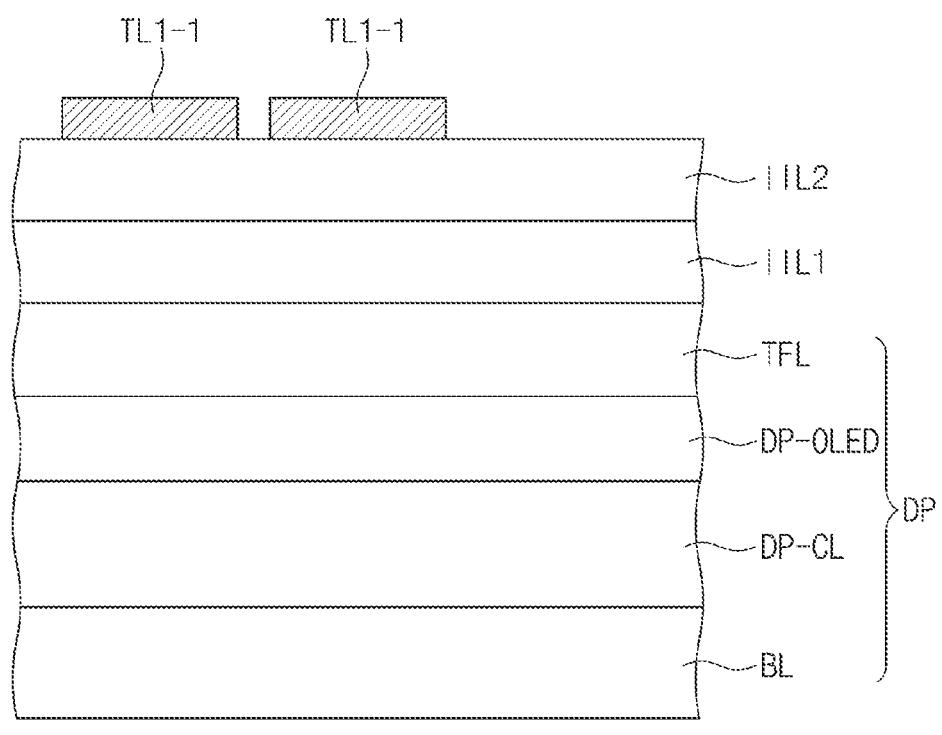
Figure 5D:
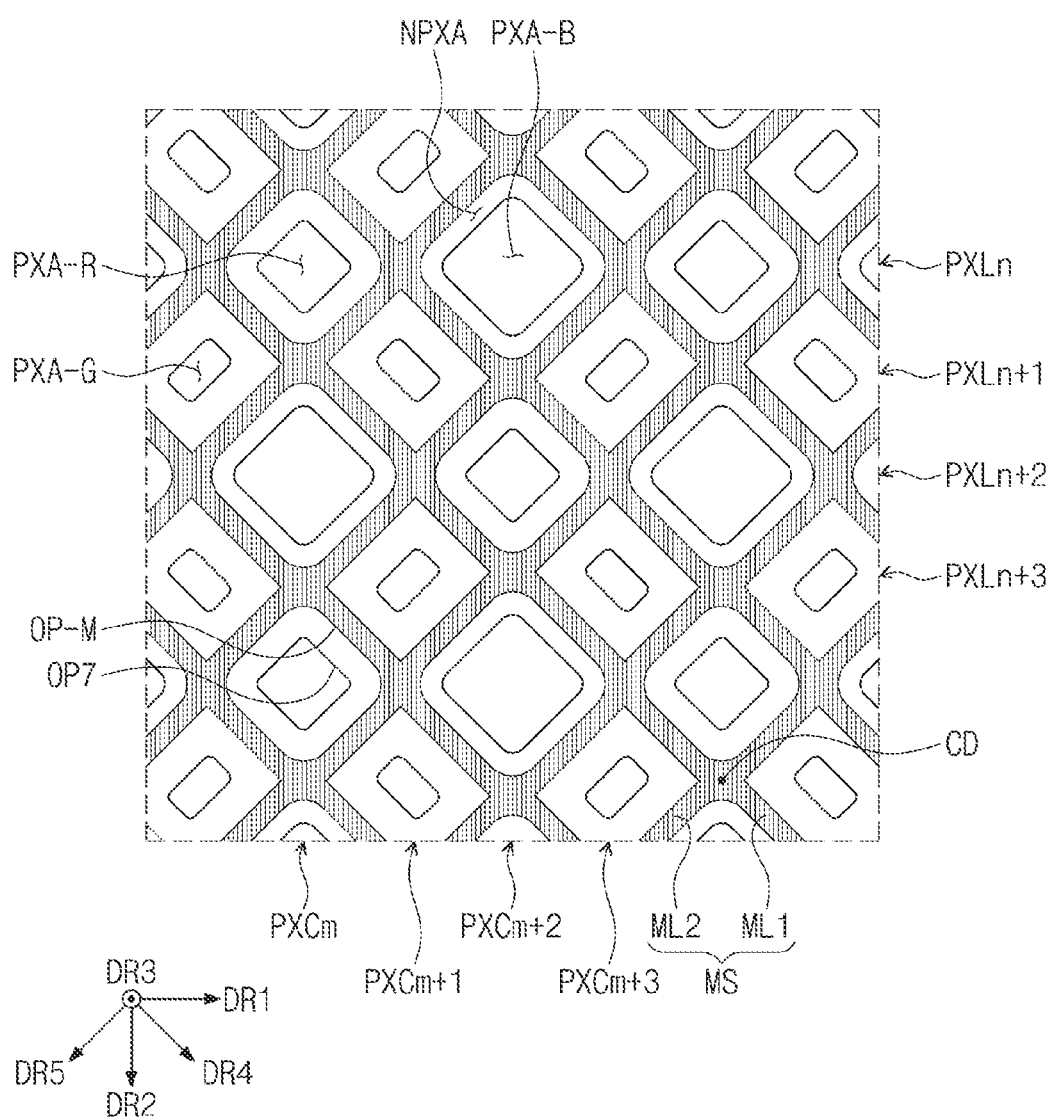
FIGS. 5D and 5E are respective plan views of a portion of an input sensing unit according to an embodiment of the inventive concept.
Figure 5E:
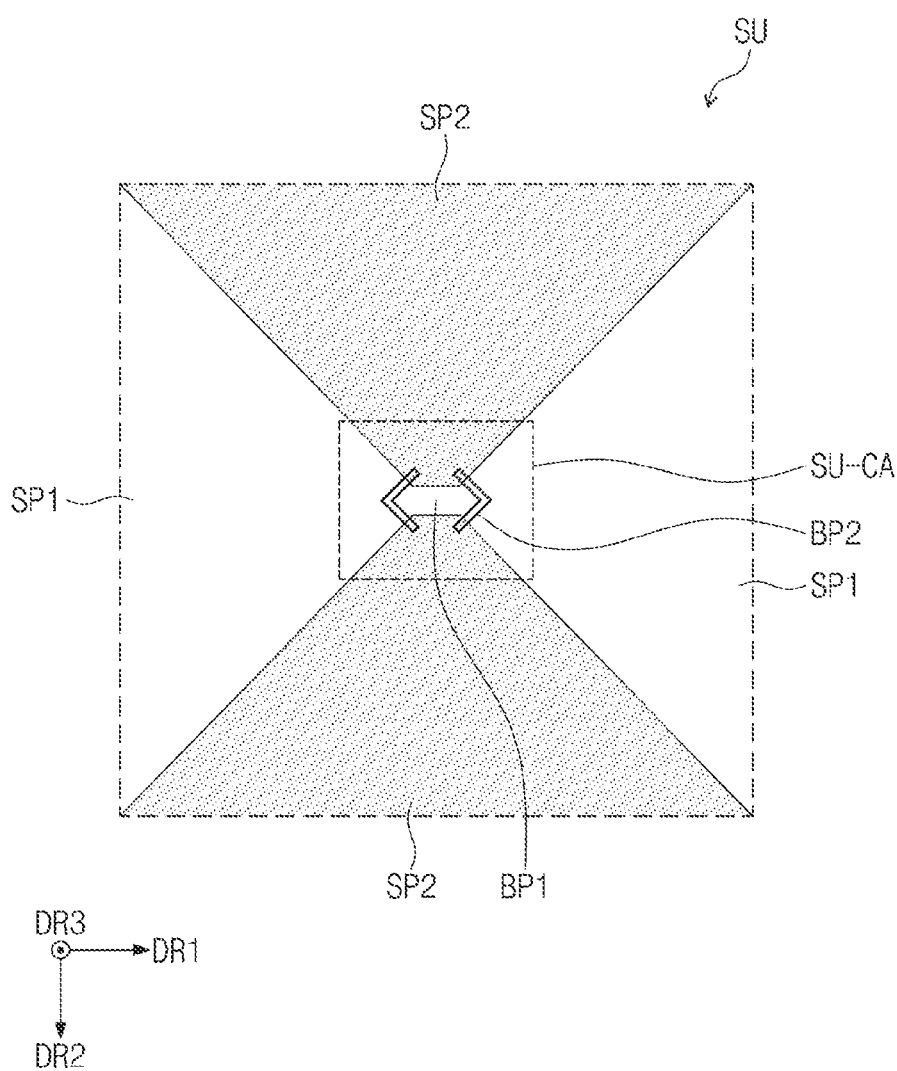
Figure 5F:
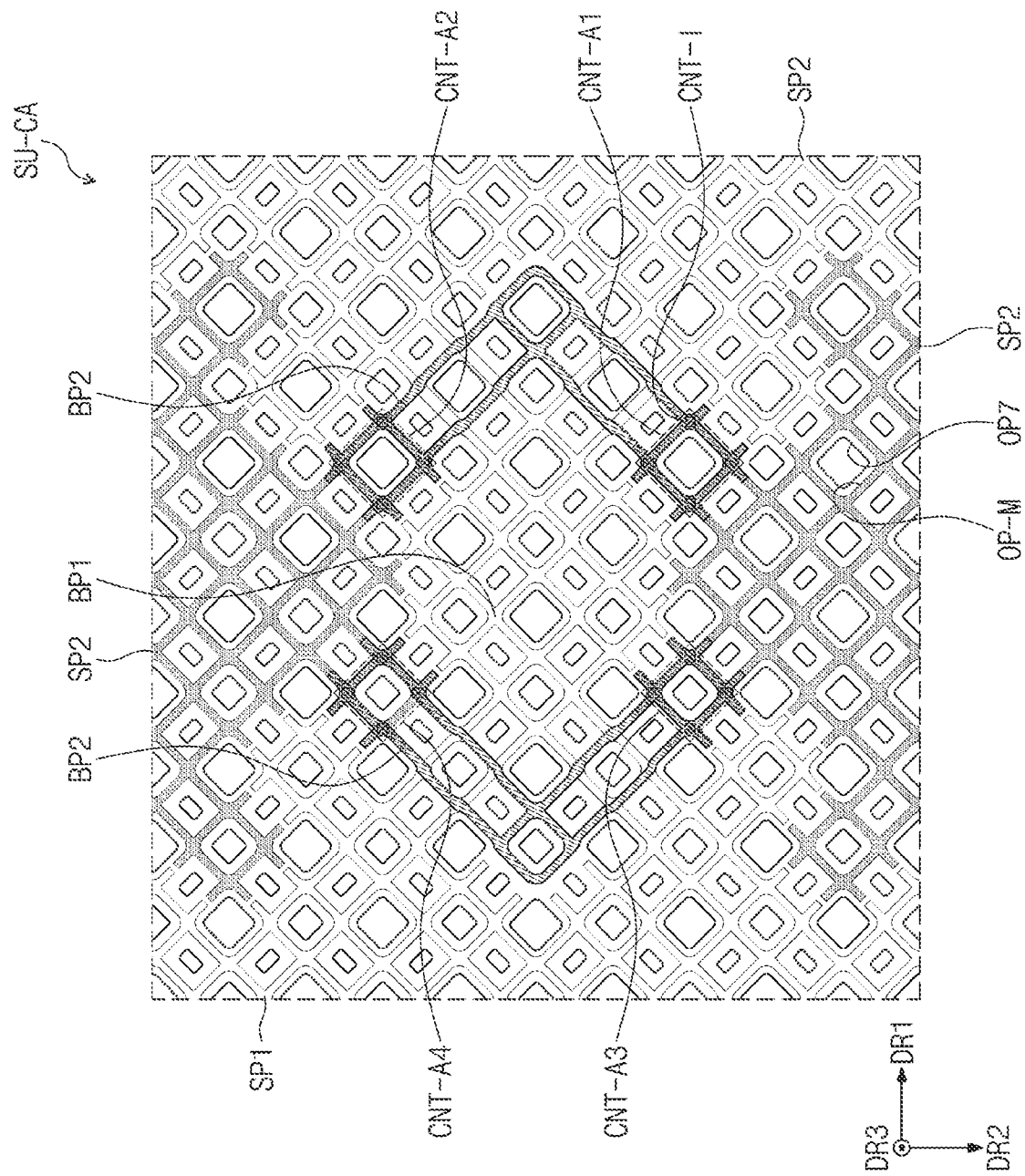
FIG. 5F is an enlarged plan view of a cross region of an input sensing unit according to an embodiment of the inventive concept.

FIG. 5A is a plan view of an input sensing unit according to an embodiment of the inventive concept. FIGS. 5B and 5C are respective cross-sectional views of a portion of an input sensing unit according to an embodiment of the inventive concept. FIGS. 5D and 5E are respective plan views of a portion of an input sensing unit according to an embodiment of the inventive concept. FIG. 5F is an enlarged plan view of a cross region of an input sensing unit according to an embodiment of the inventive concept. Hereinafter, the input sensing unit ISP will be described with further reference to FIG. 4A.

Referring to FIG. 5A, the input sensing unit ISP may be divided into an active area AA-I and a non-active area NAA-I adjacent to the active area AA-I. The active area AA-I and the non-active area NAA-I of the input sensing unit ISP may respectively correspond to the display area DA and the non-display area NDA of the display panel DP. In other words, the active area AA-I of the input sensing unit ISP may overlap the display area DA in which the light emitting elements of the plurality of respective pixels PX are disposed. In an embodiment, as shown in FIG. 5A, the active area AA-I may be defined as a rectangular shape having short sides extending in the first direction DR1 and long sides extending in the second direction DR2.

According to an embodiment of the inventive concept, the input sensing unit ISP may include a plurality of sensing electrodes TE, a plurality of trace lines TL respectively connected to the plurality of sensing electrodes TE, and an input pad unit IPD including a plurality of sensing pads. One of the ends of the plurality of trace lines TL may be connected to the plurality of sensing electrodes TE, and the other of the ends may be connected to the plurality of sensing pads disposed in the input pad IPD. Although FIG. 5A illustrates that all of the plurality of trace lines TL are disposed in the non-active area NAA-I, embodiments are not limited thereto. For example, according to embodiments, some of the plurality of trace lines TL may be disposed to overlap the active area AA-I. More particularly, some of a plurality of first trace lines TL1 and some of a plurality of second trace lines TL2 may be disposed in the active area AA-I. A detailed description thereof is provided below with reference to FIGS. 6 to 9.

The plurality of sensing electrodes TE may include a plurality of first sensing electrodes TE1 and a plurality of second sensing electrodes TE2.

The first sensing electrodes TE1 may be provided as a plurality of rows extending in the first direction DR1 and arranged along the second direction DR2. The first sensing electrodes TE1 may include first sensing patterns SP1 and first conductive patterns BP1. The first sensing patterns SP1 may extend along the first direction DR1. According to an embodiment of the inventive concept, the first sensing patterns SP1 and the first conductive patterns BP1 may be an integral type pattern patterned in the same process.

In an embodiment, the first sensing electrodes TE1 may include a plurality of row sensing electrodes. The first sensing electrodes TE1 may include a plurality of row sensing electrodes extending in the first direction DR1 and spaced apart along the second direction DR2. Each row of the plurality of row sensing electrodes may be sensing electrodes sequentially disposed along the first direction DR1. Although 11 row sensing electrodes are shown as an example, the number of rows is not limited thereto. For example, according to embodiments, the plurality of row sensing electrodes may include 10 or less, or 12 or more row sensing electrodes. The first sensing electrodes TE1 may include a first side TE1-S1 and a second side TE1-S spaced apart from each other along the first direction DR1.

The second sensing electrodes TE2 may be provided as a plurality of columns extending in the second direction DR2 and arranged along the first direction DR1. The second sensing electrodes TE2 may include second sensing patterns SP2 and second conductive patterns BP2. The second sensing patterns SP2 may extend along the second direction DR2. At least one of the second conductive patterns BP2 may be connected to two adjacent second sensing patterns SP2, and may electrically connect the two adjacent second sensing patterns SP2.

In an embodiment of the inventive concept, the second sensing electrodes TE2 may include a plurality of column sensing electrodes. The second sensing electrodes TE2 may include the plurality of column sensing electrodes extending along the second direction DR2 and spaced apart along the first direction DR1. Each column of the plurality of column sensing electrodes may be sensing electrodes sequentially disposed along the first direction DR1. Although 8 column sensing electrodes are shown as an example, the number of columns is not limited thereto. For example, according to embodiments, the plurality of column sensing electrodes may include 7 or less, or 9 or more column sensing electrodes.

According to embodiments, the first sensing electrodes TE1 and the second sensing electrodes TE2 each may have a mesh shape in which a plurality of conductive lines cross each other and a plurality of openings are defined. In an embodiment of the inventive concept, the first sensing patterns SP1 and the first conductive patterns BP1 included in the first sensing electrodes TE1, and the second sensing patterns SP2 may have a mesh shape. According to an embodiment of the inventive concept, since the first sensing electrodes TE1 and the second sensing patterns SP2 each have a mesh structure, a base capacitance caused by parasitic capacitances between the first sensing electrodes TE1 and the second electrode CE (see FIG. 3) and a base capacitance caused by parasitic capacitances between the second sensing electrodes TE2 and the second electrode CE each may be reduced more than a case where the plurality of first sensing electrodes TE1 and the second sensing patterns SP2 each have an electrode shape without an opening. Therefore, as the plurality of first sensing electrodes TE1 and the second sensing patterns SP2 each have the mesh structure, the touch sensitivity of the input sensing unit ISP may be increased. In addition, to further reduce the parasitic capacitances, some of the mesh lines providing the first sensing patterns SP1 and the second sensing patterns SP2 may be removed in a closed loop type to provide an electrically insulated dummy pattern surrounded by the closed loop in embodiments. The mesh shape of the sensing electrodes TE will be described further below with reference to FIGS. 6 to 9.

According to an embodiment of the inventive concept, the first sensing patterns SP1, the second sensing patterns SP2, and the first conductive patterns BP1, and the second conductive patterns BP2 may be included in the first sensing conductive layer ICL1 and/or the second sensing conductive layer ICL2 described with reference to FIG. 3. For example, the first sensing patterns SP1, the second sensing patterns SP2, and the first conductive patterns BP1 may be included in the second sensing conductive layer ICL2 described with reference to FIG. 3, and the second conductive patterns BP2 may be included in the first sensing conductive layer ICL1 described with reference to FIG. 3.

The plurality of trace lines TL may include a plurality of first trace lines TL1 and a plurality of second trace lines TL2. Each of the first trace lines TL1 may be connected to any corresponding one of the plurality of first sensing electrodes TE1, and each of the second trace lines TL2 may be connected to any corresponding one of the plurality of second sensing electrodes TE2. Each of the first trace lines TL1 may be connected to any corresponding one of the plurality of row sensing electrodes included in the first sensing electrodes TE1, and each of the second trace lines TL2 may be connected to any corresponding one of the plurality of column sensing electrodes included in the second sensing electrodes TE2. As shown in FIG. 5A, the first trace lines TL1 may include first side trace lines TL1-1 connected to the first side TEP1-S1 and second side trace lines TL1-2 connected to the second side TE1-S2. FIG. 5A illustrates an example in which the first side trace lines TL1-1 are connected to some of the first sensing electrodes TE1 and the second side trace lines TL1-2 are connected to the others of the first sensing electrodes TE1, but embodiments of the inventive concept are not limited thereto. For example, according to embodiments, the first side trace lines TL1-1 and the second side trace lines TL1-2 may be connected to all of the first sensing electrodes TE1.

As described above, a portion of each of the plurality of trace lines TL shown in FIG. 5A may be disposed within the active area AA-I. Some of the first trace lines TL1 and some of the second trace lines TL2 shown in FIG. 5A may be disposed in a portion of the lower end of the active area AA-I. Some of the first trace lines TL1 and some of the second trace lines TL2 may be disposed in replacement of some of the sensing electrodes TE shown in FIG. Some of the first trace lines TL1 and some of the second trace lines TL2 may be disposed in replacement of some of the first sensing electrodes TE1 and the second sensing electrodes TE2 disposed in the lower end of the active area AA-I.

In the input sensing unit ISP according to an embodiment of the inventive concept, driving signals for driving the first sensing electrodes TE1 and the second sensing electrodes TE2 may be applied thereto through the second trace lines TL2. Signals sensed by the first sensing electrodes TE1 and the second sensing electrodes TE2 may be output through the first trace lines TL1.

With respect to a line overlap area, in which the plurality of trace lines TL are disposed, in the active area AA-I, a dummy area is defined in a portion overlapping the line overlap area in the first direction, and a dummy electrode unit may be disposed in the dummy area. When the shape of the sensing electrodes disposed in the portion overlapping the line overlap area changes, the dummy electrode unit may be a component for designing so that the shape of the sensing electrodes disposed in a portion that does not overlap the line overlap area is the same as that of the sensing electrodes disposed in the overlapping portion with the line overlap area. about a further description of the dummy electrode unit is provided with reference to FIGS. 6 to 9.

Referring to FIGS. 5A, 5B and 5C, the second conductive patterns BP2 are provided from the first conductive layer ICL1 (see FIG. 3), and the first sensing patterns SP1, the first conductive patterns BP1, and the second sensing patterns Sp2 may be provided from the second conductive layer ICL2 (see FIG. 3). The second sensing patterns SP2 may be connected to the second conductive patterns BP2 through a contact hole CNT1 penetrating through a sensing insulation layer 230. Although omitted in FIGS. 5B and 5C, the third sensing insulation layer IIL3 may be disposed on the first sensing patterns SP1, the first conductive patterns BP1 and the second sensing patterns SP2 to cover them.

The plurality of first side trace lines TL1-1 may be provided from the second conductive layer ICL2 (see FIG. 3). However, embodiments of the inventive concept are not limited thereto. The plurality of first side trace lines TL1-1 may be provided from the first conductive layer ICL1 (see FIG. 3) to be disposed between the first sensing insulation layer IIL1 and the second sensing insulation layer IIL2.

Alternatively, each of the plurality of first side trace lines TL1-1 may include a plurality of layers. For example, each of the plurality of first side trace lines TL1-1 may include a first layer line provided from the first conductive layer ICL1 and a second layer line provided from the second conductive layer ICL2. The first layer line may be electrically connected to the second layer line. When the plurality of first side trace lines TL1-1 includes a plurality of layers, resistance may be further reduced. In an embodiment of the inventive concept, to design the plurality of first side trace lines TL1-1 with different respective lengths to have the same resistance value, the plurality of first side trace lines TL1-1 may be respectively designed to have different ratios between the lengths of the first layer line and the second layer line.

It is to be understood that the description, which is provided with reference to an example of the layer structure of the first side trace lines TL1-1 with reference to FIG. 5C, may also be equally applied to the layer structures of the second side trace lines TL1-2 and the second trace lines TL2, respectively.

FIG. 5D illustrates an enlarged first sensing pattern SP1 shown in FIG. 5A. The first sensing pattern SP1 may have a mesh structure. A plurality of openings OP-M may be defined in the first sensing patterns SP1. The plurality of openings OP-M may respectively correspond to the openings OP7 in the pixel definition layer PDL (see FIG. 3).

The first sensing pattern SP1 may include a plurality of mesh lines MS forming a mesh shape or a lattice shape. Each of the mesh lines MS may include first mesh lines ML1 extending in a first diagonal direction DR4 that is a direction between the first and second directions DR1 and DR2, and a second mesh line ML2 extending in a second diagonal direction DR5 crossing the first diagonal direction DR4.

According to embodiments, each of the first mesh lines ML1 is not a completely straight line, and may include a plurality of straight line regions and a plurality of inflection regions within the first diagonal direction DR4. In addition, each of the second mesh lines ML2 may also include a plurality of straight line regions and a plurality of inflection regions. Cross points CD at which the first mesh lines ML1 cross the second mesh lines ML2 may be provided as cross point rows arranged along the first direction DR1 and cross point columns arranged along the second direction DR2. According to embodiments, the first mesh lines ML1 and the second mesh lines ML2 do not overlap the light emitting areas PXA-R, PXA-G, and PXA-B. In other words, according to embodiments, the first mesh lines ML1 and the second mesh lines ML2 do overlap the non-light emitting area NPXA.

Each of the plurality of light emitting areas PXA-R, PXA-G, and PXA-B may be disposed with the corresponding pixels PX (see FIG. 4A). According to embodiments, the plurality of light emitting areas PXA-R, PXA-G, and PXA-B may define a plurality of light emitting rows arranged along the second direction DR2. The light emitting rows may include an n-th light emitting row PXLn where n is a positive integer, an (n+1)-th light emitting row PXLn+1, an (n+2)-th light emitting row PXLn+2, and an (n+3)-th light emitting row PXLn+3. The four light emitting rows PXLn, PXLn+1, PXLn+2, and PXLn+3 may provide one unit and be arranged repetitively along the second direction DR2. Each of the four light emitting rows PXLn, PXLn+1, PXLn+2, and PXLn+3 may extend along the first direction DR1.

The n-th light emitting row PXLn includes first color light emitting areas PXA-R and third color light emitting areas PXA-B that are alternately disposed along the first direction DR1. The (n+2)-th light emitting row PXLn+2 includes third color light emitting areas PXA-B and first color light emitting areas PXA-R that are alternately disposed along the first direction DR1.

A disposition order of the light emitting areas in the n-th light emitting row PXLn may differ from that of the light emitting areas in the (n+2)-th light emitting row PXLn+2. The third color light emitting areas PXA-B and the first color light emitting areas PXA-R in the n-th light emitting row PXLn may be alternately disposed with the third color light emitting areas PXA-B and the first color light emitting areas PXA-R in the (n+2)-th light emitting row PXLn. The light emitting areas of the n-th light emitting row PXLn may be the same as shifted by one light emitting area from the light emitting areas of the (n+2)-th light emitting row PXLn+2 along the second direction DR2.

Each of the (n+1)-th light emitting row PXLn+1 and the (n+3)-th light emitting row PXLn+3 is provided with second color light emitting areas PXA-G. The light emitting areas in the n-th light emitting row PXLn are alternately disposed with the light emitting areas in the (n+1)-th light emitting row PXLn+1. The light emitting areas in the (n+2)-th light emitting row PXLn+2 may be alternately disposed with the light emitting areas in the (n+3)-th light emitting row PXLn+3.

According to embodiments, the plurality of light emitting areas PXA-R, PXA-G, and PXA-B may define a plurality of light emitting rows arranged along the first direction DR1. The light emitting rows may include an m-th light emitting row PXCm where m is a positive integer, an (m+1)-th light emitting row PXCm+1, an (m+2)-th light emitting row PXCm+2, and an (m+3)-th light emitting row PXCm+3. The four light emitting rows PXCm, PXCm+1, PXCm+2, and PXCm+3 may provide one unit and be arranged repetitively along the first direction DR1. Each of the four light emitting rows PXCm, PXCm+1, PXCm+2, and PXCm+3 may extend along the second direction DR2.

The configuration of the light emitting areas PXA-B, PXA-R, and PXA-G included in each of the light emitting rows PXCm, PXCm+1, PXCm+2, and PXCm+3 may be determined according to the arrangement of the PXA-B, PXA-R, and PXA-G in the foregoing light emitting rows PXLn, PXLn+1, PXLn+2, and PXLn+3. For example, referring to FIG. 5D, the m-th light emitting row PXCm includes first color light emitting areas PXA-R and third color light emitting areas PXA-B that are alternately disposed along the second direction DR2, and the (m+2)-th light emitting row PXCm+2 includes third color light emitting areas PXA-B and first color light emitting areas PXA-R that are alternately disposed along the second direction DR2. In addition, each of the (m+1)-th light emitting row PXCm+1 and the (m+3)-th light emitting row PXCm+3 is provided with second color light emitting areas PXA-G. However, embodiments of the inventive concept are not limited thereto.

Although an arrangement type of the light emitting areas PXA-R, PXA-G, and PXA-G is shown in FIG. 5D as an example, embodiments of the inventive concept are not limited thereto. For example, the areas and the arrangement type of the light emitting areas PXA-R, PXA-G, and PXA-G may vary according to the desired display quality of the display device.

FIG. 5E is an expanded plan view illustrating one sensing unit in the input sensing unit shown in FIG. 5A. In an embodiment, the sensing unit SU may refer to two first sensing patterns SP1 and two second sensing patterns SP2 that are adjacent to each other, and a first conductive pattern BP1 and a second conductive pattern BP2 that are disposed therebetween. FIG. 5F is an enlarged cross area SU-CA of the sensing unit SU shown in FIG. 5E.

Referring to FIGS. 5A, 5E, and 5F, the input sensing unit ISP may be divided into a plurality of the sensing units SU. Each of the sensing units SU may include a corresponding cross area SU-CA among cross areas of the first sensing patterns SP1 and the second sensing patterns SP2. The cross area SU-CA may be disposed with the second conduction patterns BP2. The sensing unit SU may include a half of the first sensing patterns SP1, the other half of the first sensing patterns SP1, the first conductive pattern BP1 interposed therebetween, a half of the second sensing patterns SP2, two second conductive patterns BP2, and the other half of the second patterns SP2.

In the cross area SU-CA, the two second conductive patterns BP2 may connect the two second sensing patterns SP2. First to fourth connection areas CNT-A1 to CNT-A4 are provided between the two second conductive patterns BP2 and the two second sensing patterns SP2. The first to fourth connection areas CNT-A1 to CNT-A4 may be respectively provided with four contact holes CNT-I therethrough. The first sensing patterns SP1 may be directly connected through the first conductive pattern BP1 without a separate contact hole.

Figure 6:
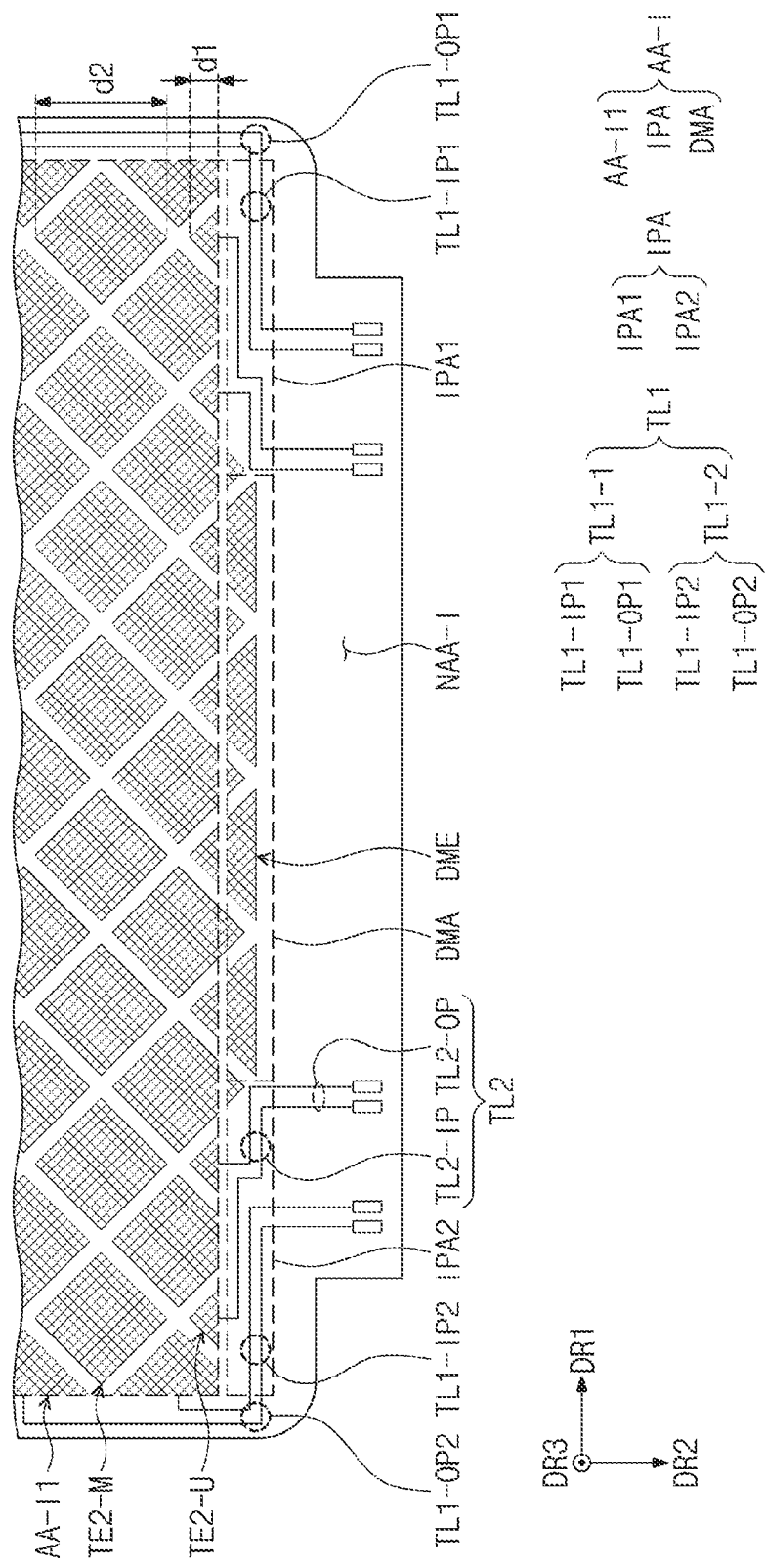
FIG. 6 is an enlarged plan view of an input sensing unit according to an embodiment of the inventive concept.
Figure 7A:
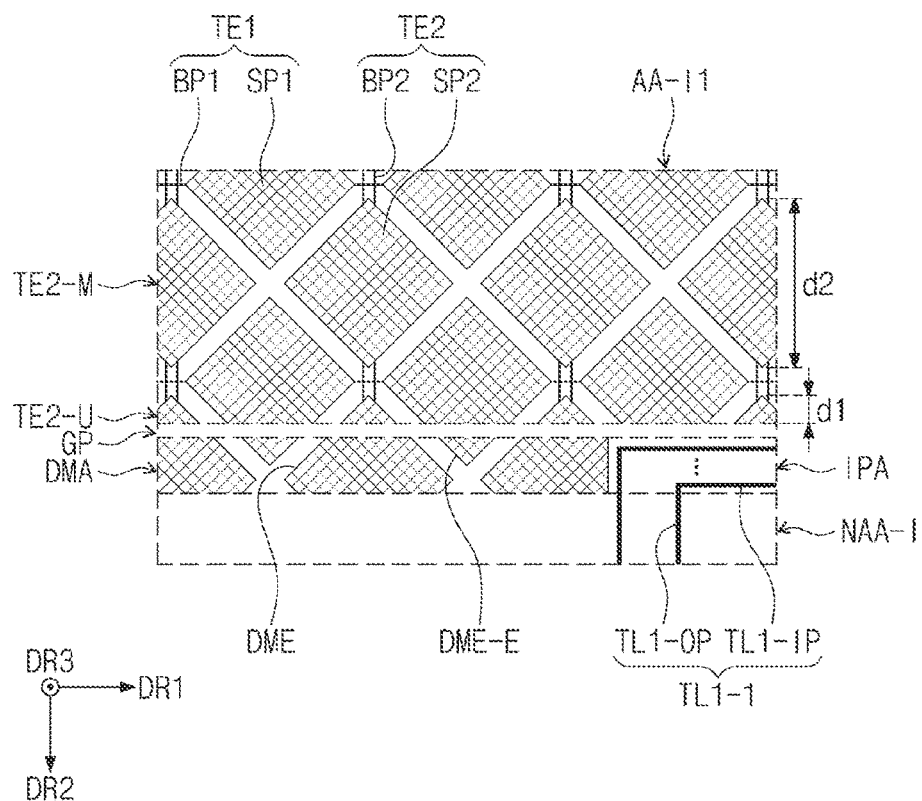
FIGS. 7A and 7B are respective plan views of a portion of an input sensing unit according to an embodiment of the inventive concept.
Figure 7B:
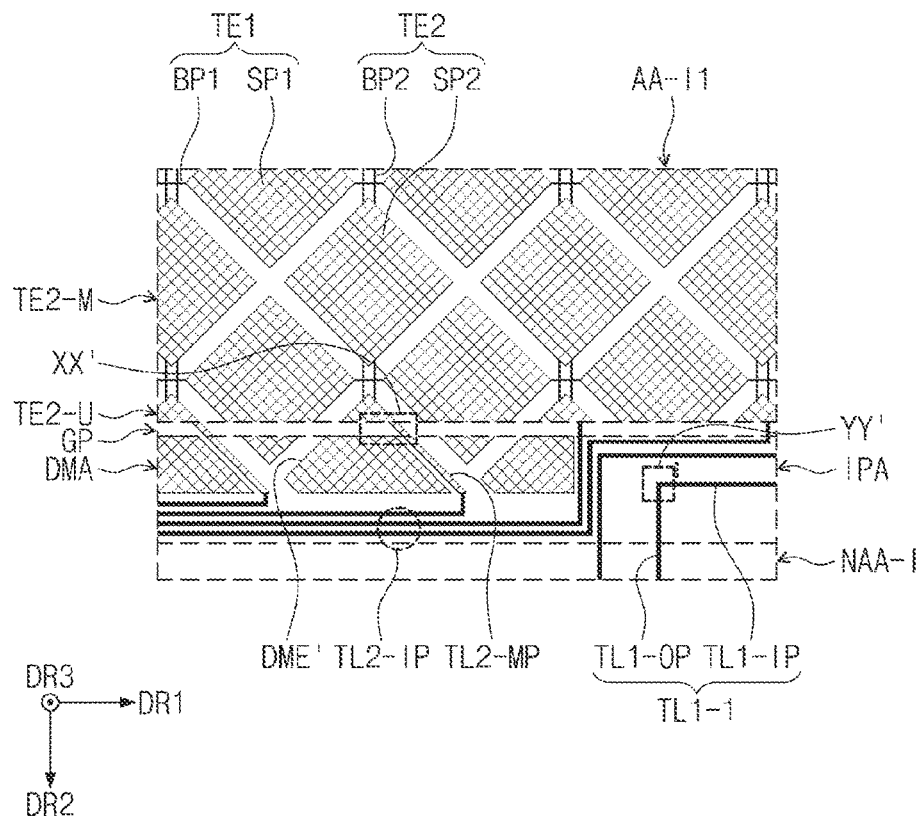

FIG. 6 is an enlarged plan view of an input sensing unit according to an embodiment of the inventive concept. FIGS. 7A and 7B are respective plan views of a portion of an input sensing unit according to an embodiment of the inventive concept. FIG. 6 illustrates an enlarged configuration of electrodes and lines in the lower end portion of the input sensing unit according to an embodiment as shown in FIG. 5A. FIGS. 7A and 7B show enlarged views of the dummy area DMA, a line overlap area IPA, and a portion of a main area AA-I1 adjacent thereto in the lower end portion of the input sensing unit shown in FIG. 6.

Referring to FIGS. 5A, 6, 7A, and 7B, in the input sensing unit ISP according to an embodiment, at least some of the plurality of trace lines TL1 include inner portions TL1-IP1 and TL1-IP2 overlapping the active area AA-I. An area in which the inner portions TL1-IP1 and TL1-IP2 are disposed in the active area AA-I may be defined as the line overlap area IPA. The line overlap area IPA may be defined in a corner part AA-C in which a long side and a short side of the active area AA-I meet. The line overlap area IPA may be defined in the corner part AA-C defined by an edge in the first direction DR1 and an edge in the second direction DR2 in the active area AA-I, and the inner portions TL1-IP1 and TL1-IP2 may be disposed in the corner part AA-C in the active area AA-I.

The input sensing unit ISP according to an embodiment of the inventive concept includes a dummy electrode unit DME. The dummy electrode unit DME is disposed so as to overlap the inner portions TL1-IP1 and TL1-IP2 among the plurality of first trace lines TL1 in the first direction DR1. A portion in which the dummy electrode unit DME is disposed in the active area AA-I may be defined as the dummy area DMA. In the input sensing unit ISP according to an embodiment, the active area AA-I may be divided into the main area AA-I1 with the plurality of sensing electrodes TE disposed therein, the dummy area DMA with the dummy electrode unit DME disposed therein, and the line overlap area IPA with the inner portions TL1-IP1 and TL1-IP2 disposed therein. The dummy area DMA may be defined to overlap the line overlap area IPA in the first direction DR1.

As shown in FIG. 6, the dummy area DMA may have a rectangular shape extending in the first direction DR1 and the second direction DR2 in a plan view. An extension length of the dummy area DMA in the first direction DR1 may be about 8 mm to about 16 mm. The extension length of the dummy area DMA in the first direction DR1 may be, for example, about 12 mm. An extension length of the dummy area DMA in the second direction DR2 may be about 0.5 mm to about 1.1 mm. The extension length of the dummy area DMA in the second direction DR2 may be about 0.8 mm.

According to embodiments, the dummy electrode unit DME disposed in the dummy area DMA may have the structure including a plurality of mesh lines, and as shown in FIG. 5D, each of the light emitting areas PXA-R, PXA-G, and PXA-B (see FIG. 5D) may be disposed between the mesh lines. In other words, the dummy area DMA may overlap the display area DA (see FIG. 4A) of the display panel DP (see FIG. 4A), and the plurality of pixels PX (see FIG. 4A) may overlap the dummy area DMA. The pixels PX overlapping the dummy area DMA may be provided in about 300 columns to about 400 columns along the first direction DR1. The pixels PX overlapping the dummy area DMA may be provided in about 15 rows to about 25 rows along the second direction DR2. The dummy electrode unit DME may overlap the inner portions TL1-IP1 and TL1-IP2 in the first direction DR1, and overlap the plurality of sensing electrodes TE in the second direction DR2. According to embodiments, the dummy electrode unit DME does not overlap the plurality of electrodes TE in the first direction DR1. In other words, according to embodiments, the dummy area DMA does not overlap the main area AA-I1 in the first direction DR1, and may be provided in a separate row.

Each of the first side trace line TL1-1 and the second side trace line TL1-2 included in the plurality of first trace lines TL1 may respectively include inside portions TL1-IP1 and TL1-IP2. The first side trace line TL1-1 may include a first inside portion TL1-IP1 overlapping the active area AA-I and the second side trace line TL1-2 may include a second inside portion TL1-IP2 overlapping the active area AA-I. Each of the first inside portion TL1-IP1 and the second inside portion TL1-IP2 may be spaced apart from each other in the first direction DR1. Each of the first inside portion TL1-IP1 and the second inside portion TL1-IP2 may be disposed in the corner part AA-C of the active area AA-I. On the basis of the first direction DR1, The dummy electrode unit DME may be disposed between the first inside portion TL1-IP1 and the second inside portion TL1-IP2. A portion disposed in the first inside portion TL1-IP1 in the active area AA-I may be defined as a first line overlap area IPA1, and a portion disposed in the second inside portion TL1-IP2 may be defined as a second line overlap area IPA2. On the basis of the first direction DR1, the dummy area DMA may be defined between the first line overlap area IPA1 and the second line overlap area IPA2.

According to embodiments, the first side trace line TL1-1 and the second side trace line TL1-2 included in the plurality of first trace lines TL1 may respectively include outside portions TL1-OP1 and TL1-OP2 in addition to the inside portions TL1-IP1 and TL1-IP2. According to embodiments, the outside portions TL1-OP1 and TL1-OP2 do not overlap the active area AA-I and do overlap the non-active area NAA-I. The outside portions TL1-OP1 and TL1-OP2 may include a portion in which the plurality of first sensing electrodes TE1 are connected to the inside portions TL1-IP1 and TL1-IP2, and a portion in which the inside portions TL1-IP1 and TL1-IP2 are connected to the input pad unit IPD. The first side trace line TL1-1 may include the first outside portion TL1-OP1 and the second side trace line TL1-2 may include the second outside portion TL1-IP2.

The plurality of second sensing electrodes TE2 may include a plurality of unit sensing electrodes TE2-U disposed adjacent to the dummy electrode unit DME. Each of the plurality of unit sensing electrodes TE2-U may be arranged in parallel along the first direction DR1. Each of the plurality of unit sensing electrodes TE2-U may be provided as one row spaced apart from each other along the first direction DR1. Gap portions GP may be respectively defined between the plurality of unit sensing electrodes TE2-U and the dummy electrode unit DME, and between the plurality of unit sensing electrodes TE2-U and the inside portions TL1-IP1 and TL1-IP2. According to embodiments, the plurality of unit sensing electrodes TE2-U and the dummy electrode unit DME may be disconnected by the gap portion GP, and are not electrically connected. In other words, the dummy electrode unit DME is separated from the plurality of second sensing electrodes TE2 such as the plurality of unit sensing electrodes TE2-U to be floated, and thus, may not be influenced by a signal delivered to the plurality of the second sensing electrodes TE2.

Each of the plurality of unit sensing electrodes TE2-U may be a certain width on the basis of the second direction DR2. In other words, a first width d1 in the second direction DR2 may be substantially uniform with respect to the plurality of unit sensing electrodes TE2-U arranged along the first direction DR1. The expression "substantially uniform" means not only that the numerical value of the width or the like is the same, but also that the numerical value is in the range of allowable tolerance possibly occurring during fabrication processes.

The plurality of second sensing electrodes TE2 may include a plurality of main sensing electrodes TE2-M spaced apart from the plurality of unit sensing electrodes TE2-U. In an embodiment of the inventive concept, the remaining sensing electrodes except for the plurality of unit sensing electrodes TE2-U among the plurality of second sensing electrodes TE2 may correspond to the main sensing electrodes TE2-M. The plurality of main sensing electrodes TE2-M may be arranged in parallel along the first direction DR1 in correspondence to the plurality of unit sensing electrodes TE2-U.

Each of the plurality of main sensing electrodes TE2-M may have a larger width than the plurality of unit sensing electrodes TE2-U in the second direction DR2. A second width d2, which is the width of the plurality of main sensing electrodes TE2-M in the second direction DR2, may be larger than the first width d1, which is the width of the plurality of unit sensing electrodes TE2-U in the second direction DR2. In an embodiment, the second width d2 may be larger than double the first width d1. The plurality of unit sensing electrodes TE2-U have the shape reduced in size due to the dummy electrode unit DMEs disposed adjacent thereto and the inside portions TL1-IP1 and TL1-IP2, and thus, the first width d1 is smaller than a half of the second width d2.

Referring to FIGS. 6 and 7A, the dummy electrode units DME corresponding to the plurality of unit sensing electrodes TE2-U, and additional dummy electrode units DME-E, may be disposed in the dummy area DMA. The additional dummy electrodes DME-E may correspond to the first sensing electrodes TE1 adjacent to the dummy area DMA among the plurality of first sensing electrodes TE1. The first sensing electrodes TE1 adjacent to the dummy area DMA may have the shape reduced in size due to the additional dummy electrode units DME-E disposed adjacent thereto and the inside portions TL1-IP1 and TL1-IP2. Since the gap portion GP is defined between the first sensing electrodes TE1 adjacent to the dummy area DMA and the additional dummy electrode units DME-E, the additional dummy electrodes DME-E are separated from the first sensing electrodes TE1 to be floated, and thus, may not be influenced by a signal delivered to the first sensing electrodes TE1.

Referring to FIGS. 6 and 7B, the plurality of second trace lines TL2 may be connected to the plurality of unit sensing electrodes TE2-U. Since the dummy area DMA and the line overlap area IPA are defined between the plurality of unit sensing electrodes TE2-U and the non-active area NAA-I, at least some of the plurality of second trace lines TL2 may overlap the dummy area DMA and the line overlap area IPA. The plurality of second trace lines TL2 may include a third inside portion TL2-IP overlapping the dummy area DMA and the line overlap area IPA and a third outside portion TL2-OP overlapping the non-active area NAA-I. A dummy electrode unit DME' may overlap a portion of the third inside portion TL2-IP in the first direction DR1.

As described above, the line overlap area IPA may be disposed with some of the plurality of first trace lines TL1 and some of the plurality of second trace lines TL2. In FIG. 7B or the like, for convenience of illustration, the number of lines disposed in the line overlap area IPA among the plurality of first trace lines TL1 and the plurality of second trace lines TL2 is reduced, but the larger number of trace lines than that shown in the drawing may be disposed in the line overlap area IPA. In an embodiment of the inventive concept, the number of first trace lines TL1 disposed in the line overlap area IPA may be about 18 to about 20. The number of second trace lines TL2 disposed in the line overlap area IPA may be about 3 or about 4. The number of second trace lines TL2 disposed in the line overlap area IPA may be smaller than about 30% of the number of first trace lines TL1 disposed in the line overlap area IPA.

According to embodiments, some of the plurality of first trace lines TL1 and some of the plurality of second trace lines TL2 disposed in the line overlap area IPA each may be disposed at a certain interval. Accordingly, the area occupied by the second trace lines TL2 disposed in the line overlap area IPA and the area occupied by the first trace lines TL1 disposed in the line overlap area IPA may be directly proportional to the number of trace lines disposed in the line overlap area IPA. In other words, the area of the second trace lines TL2 disposed in the line overlap area IPA may be smaller than about 30% of the area of the first trace lines TL1 disposed in the line overlap area IPA.

The plurality of second trace lines TL2 may further respectively include mesh connection portions TL2-MP directly connected to the plurality of unit sensing electrodes TE2-U. Like the plurality of unit sensing electrodes TE2-U, each of the mesh connection portions TL2-MP may have a mesh shape in which a plurality of openings are defined. In other words, each of the mesh connection portions TL2-MP may have a plurality of mesh lines MS (see FIG. 5D). The mesh connection portions TL2-MP may be provided through the same mask process as the process for providing the plurality of second sensing electrodes TE2 including the plurality of unit sensing electrodes TE2-U. FIG. 7B illustrates an example in which the mesh connection portions TL2-MP are respectively connected to right bottom ends of the plurality of unit sensing electrodes TE2-U, but embodiments of the inventive concept are not limited thereto. For example, according to embodiments, the mesh connection portions TL2-MP may be respectively connected to central bottom portions of the plurality of unit sensing electrodes TE2-U. In this case, the mesh connection portion TL2-MP may penetrate through a central portion of the dummy electrode unit DME to be connected to the third inside portion TL2-IP.

According to embodiments, each of the plurality of first trace lines TL1 and the plurality of second trace lines TL2 may partially have a mesh shape. As shown in FIG. 7B, the mesh connection portion TL2-MP among the plurality of second trace lines TL2 may have a mesh shape, and each of the third inside portion TL2-IP and the third outside portion TL2-OP may also have a mesh shape. The inside portion TL1-IP1 included in the plurality of first trace lines TL1 may have a mesh shape, and each of the outside portions TL1-OP1 and TL1-OP2 may also have a mesh shape.

The input sensing unit included in the display device of an embodiment is defined with a line overlap area in which the plurality of first trace lines are partially disposed in the active area. Accordingly, the area of the non-active area utilized for a path along which the first trace lines pass is reduced, and thus, a dead space of the display device may be reduced. However, as the line overlap area is defined, the sensing electrode in an area corresponding thereto has a reduced size, which may thereby cause the sensitivity to be reduced in comparison to sensing electrodes of which the sizes are not reduced.

In the input sensing unit included in the display device of an embodiment of the inventive concept, the dummy area is provided in parallel to a predetermined direction in correspondence to the line overlap area, and the dummy electrode unit, which is not electrically connected to the sensing electrode, is disposed in the dummy area. Accordingly, not only the sensing electrode in the area corresponding to the line overlap area, but also the sensing electrode in the area corresponding to the dummy area has a reduced size. As a result, a sensitivity deviation between the sensing electrodes arranged in the predetermined direction may be reduced. Therefore, the sensing performance of the input sensing unit may be improved, and a display device including the same may have increased reliability.

Figure 8A:
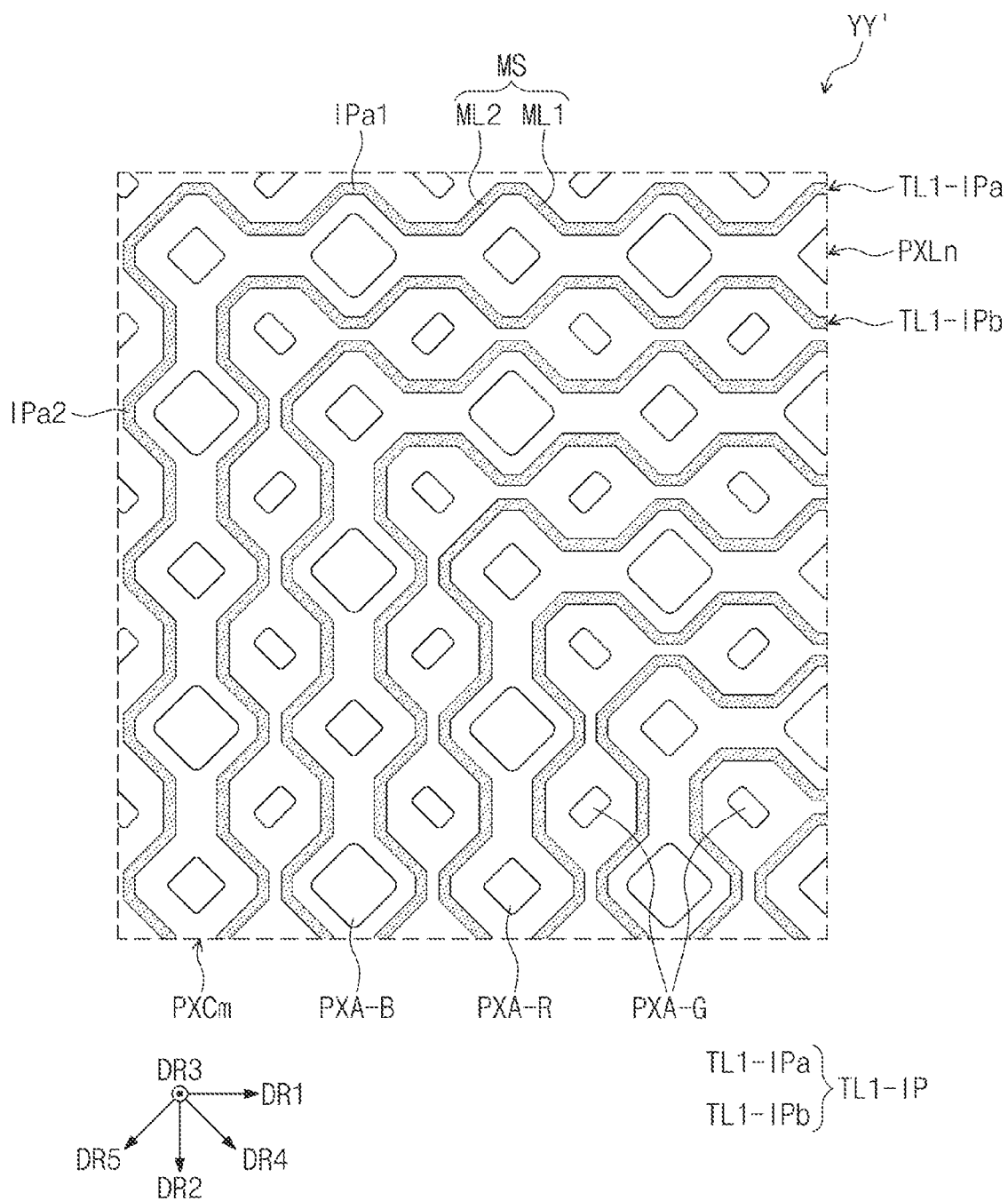
FIGS. 8A and 8B are respective enlarged plan views of a portion of an input sensing unit according to an embodiment of the inventive concept.
Figure 8B:
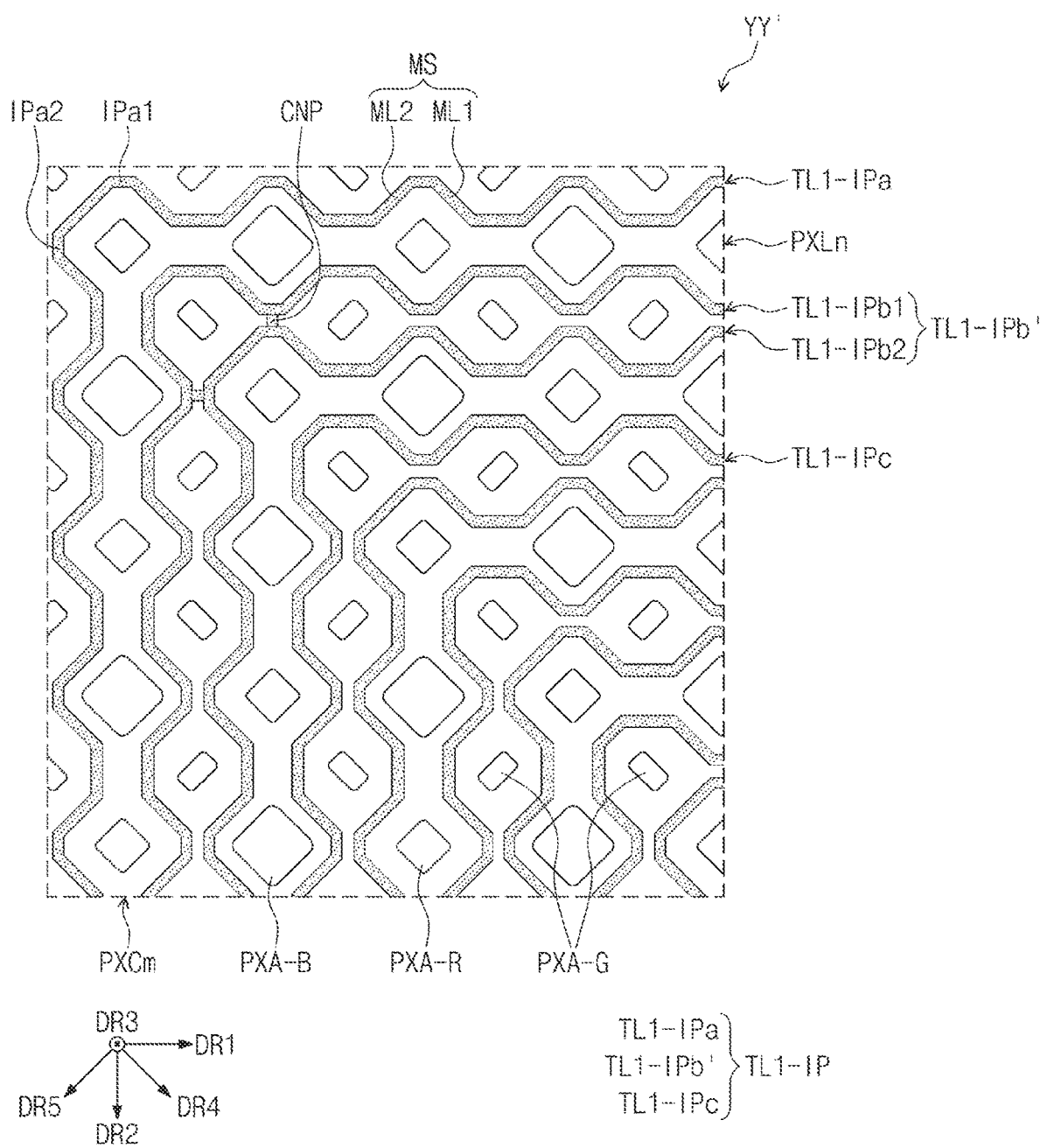

FIGS. 8A and 8B are respective enlarged plan views of a portion of the input sensing unit according to an embodiment of the inventive concept. FIGS. 8A and 8B show enlarged views of the line overlap area IPA in a lower end portion of the input sensing unit shown in FIG. 7B. FIGS. 8A and 8B show enlarged views of a YY' portion shown in FIG. 7B.

Referring to FIGS. 6 and 8A, the inside portion TL1-IP1 disposed in the line overlap area IPA may have a structure including a plurality of mesh lines MS. Each of the mesh lines MS may include a first mesh line extending in the first diagonal direction DR4 between the first and second directions DR1 and DR2, and a second mesh line ML2 extending in the second diagonal direction DR5 crossing the first diagonal direction DR4. According to embodiments, the first mesh line ML1 and the second mesh line ML2 do not overlap the light emitting areas PXA-R, PXA-G, and PXA-B. The inside portion TL1-IP1 may include a plurality of lines TL1-IPa and TL1-IPb. The inside portion TL1-IP1 may include an a-th trace line TL1-IPa, a b-th trace line TL1-IPb or the like. Each of the plurality of lines TL1-IPa and TL1-IPb included in the inside portion TL1-IP1 may include a first portion IPa1 extending along the first direction DR1 and a second portion IPa2 extending along the second direction DR2.

Referring to FIGS. 6 and 8B, the inside portion TL1-IP1 disposed in the line overlap area IPA includes a plurality of lines TL1-IPa, TL1-IPb' and TL1-IPc, and at least some of the plurality of lines TL1-IPa, TL1-IPb', and TL1-IPc may have the shape in which two or more mesh lines MS are connected. More particularly, as shown in FIG. 8B, for a b-th trace line TL1-IPb' among a plurality of lines TL1-IPa, TL1-IPb', and TL1-IPc included in the inside portion TL1-IP1, the b-th trace line TL1-IPb' includes a 1b-th line TL1-IPb1 and a 2b-th line TL1-IPb2, which is spaced apart from the 1b-th line TL1-IPb1 along the first direction DR1 and the second direction DR2, and the 1b-th line TL1-IPb1 and the 2b-th line TL1-IPb2 may be connected through a connection part CNP. Each of the 1b-th line TL1-IPb1 and the 2b-th line TL1-IPb2 may be included in the b-th trace line TL1-IPb' to be respectively connected to the sensing electrodes in the same row among the first sensing electrodes TE1. As some of the plurality of lines TL1-IPa, TL1-IPb', and TL1-IPc have the shape in which two or more mesh lines MS are connected, the plurality of lines having different lengths may be designed to have the same resistance value.

Figure 9:
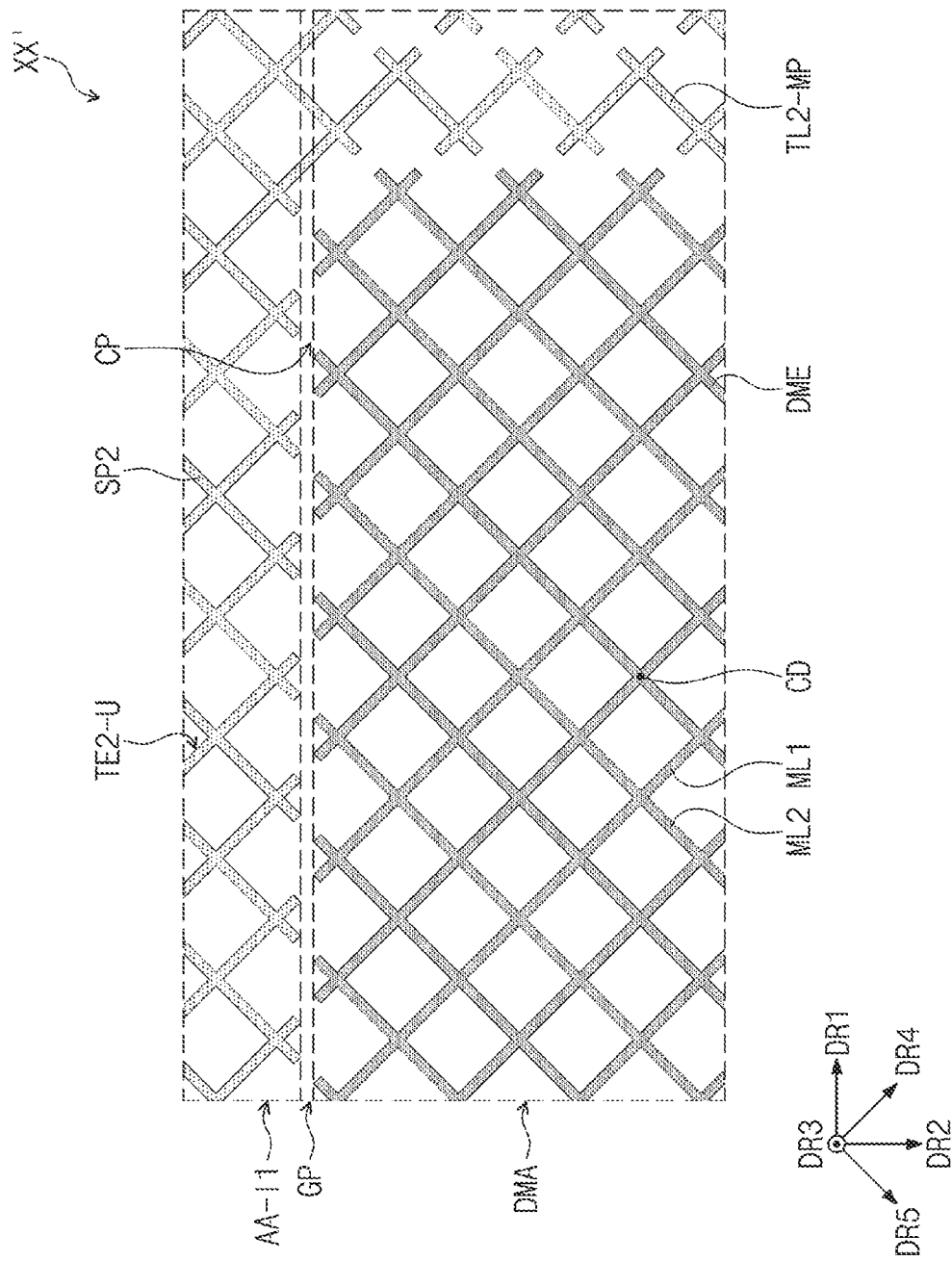
FIG. 9 is an enlarged plan view of a portion of an input sensing unit according to an embodiment of the inventive concept.

FIG. 9 is an enlarged plan view of a portion of the input sensing unit according to an embodiment of the inventive concept. In FIGS. 8A and 8B, the dummy area DMA, and portion of the main area AA-I1 adjacent thereto in the lower end portion of the input sensing unit shown in FIG. 7B, are illustrated in enlarged views. FIGS. 8A and 8B show the enlarged views of the XX' portion shown in FIG. 7B.

Referring to FIGS. 6, 7B, and 9, each of the dummy electrode unit DME, the unit sensing electrodes TE2-U, and the mesh connection portions TL2-MP may have a structure including the plurality of mesh lines MS. Each of the mesh lines MS may include the first mesh line ML1 extending in the first diagonal direction DR4 between the first and second directions DR1 and DR2, and the second mesh line ML2 extending in the second diagonal direction DR5 crossing the first diagonal direction DR4. Cross points CD at which the first mesh lines ML1 cross the second mesh lines ML2 may be provided as cross point rows arranged along the first direction DR1 and cross point columns arranged along the second direction DR2.

FIG. 9 shows an example of the mesh connection portion TL2-MP having the shape in which the mesh lines extending in the diagonal directions DR4 and DR5 are included and a main extension direction of the lines is the second direction DR2. However, embodiments of the inventive concept are not limited thereto. For example, according to embodiments, as shown in FIG. 7B, the main extension direction of the lines of the mesh connection portion TL2-MP may be the diagonal direction. For example, the mesh connection portion TL2-MP may have the shape in which the main extension direction of the lines is the first diagonal direction DR4.

The gap portion GP is defined between the dummy area DMA and the main area AA-I1, and thus, the dummy electrode units DME and the unit sensing electrodes TE2-U, which are disposed adjacent to each other, may have a cut shape and not be electrically connected. The dummy electrode units DME and the unit sensing electrodes TE2-U, which are disposed adjacent to each other, may have the cut shape in which some of the mesh lines are cut through a cutting part CP.

The mesh connection portion TL2-MP directly connected to the unit sensing electrode TE2-U may have a structure including a plurality of mesh lines MS. The dummy electrode units DME and the unit sensing electrodes TE2-U, which are disposed adjacent to each other, may have the cut shape in which some of the mesh lines are cut through the cutting part CP. The mesh connection portion TL2-MP may have an integral shape with the unit sensing electrode TE2-U. The dummy electrode units DME, the unit sensing electrodes TE2-U, and the mesh connection portions TL2-MP may be provided in continuous mesh shapes through the same mask process, and then the cutting parts CP are provided between the dummy electrode units DME and the unit sensing electrodes TE2-U and between the dummy electrode units DME and the mesh connection portions TL2-MP.

According to embodiments of the inventive concept, the input sensing unit and the display device including the same may be provided in which some of trace lines included in the input sensing unit are disposed in the active area. As a result, the dead space may be reduced, and a variation in sensitivity may be prevented between the sensing electrodes arranged in a predetermined direction. As a result, the sensing performance of the input sensing unit may be improved.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to embodiments thereof, it will be understood by those of ordinary skill in the art that various changes in form and detail may be made therein without departing from the spirit and scope of the present inventive concept as defined by the following claims.

What is claimed is:

1. A display device comprising:
    a display panel divided into a display area and a non-display area; and
    an input sensing unit disposed on the display panel and divided into an active area overlapping the display area and a non-active area overlapping the non-display area,
    wherein the input sensing unit comprises:
    a plurality of sensing electrodes overlapping the active area and comprising a plurality of first sensing electrodes extending in a first direction, and a plurality of second sensing electrodes extending in a second direction crossing the first direction;
    a plurality of first trace lines respectively connected to the plurality of first sensing electrodes and comprising an inside portion overlapping the active area; and
    a dummy electrode unit overlapping the inside portion in the first direction,
    wherein the dummy electrode unit and the inside portion are disposed in a line overlap area of the active area, the line overlap area is disposed at a boundary of the active area and the non-active area, and the dummy electrode unit does not extend outside of the line overlap area.

2. The display device of claim 1, wherein the active area has a short side extending in the first direction and a long side extending in the second direction, and the inside portion overlaps a corner part at which the short side is connected to the long side.

3. The display device of claim 1, wherein the plurality of first trace lines comprise:
a first side trace line connected to a first side of the plurality of first sensing electrodes; and
a second side trace line connected to a second side spaced apart from the first side along the first direction.

4. The display device of claim 3, wherein the first side trace line comprises a first inside portion overlapping the active area,
the second side trace line comprises a second side portion overlapping the active area and spaced apart from the first inside portion in the first direction, and
the dummy electrode unit is disposed between the first inside portion and the second inside portion.

5. The display device of claim 1, wherein the input sensing unit further comprises:
a plurality of second trace lines respectively connected to the plurality of second sensing electrodes, and at least partially overlapping the active area,
wherein the dummy electrode unit overlaps a portion of the plurality of second trace lines in the first direction.

6. The display device of claim 5, wherein the portion of the plurality of second trace lines, which overlap the dummy electrode unit in the first direction, are disposed in the line overlap area,
some of the plurality of first trace lines and some of the plurality of second trace lines are disposed in the line overlap area, and
a number of the plurality of second trace lines partially disposed in the line overlap area is smaller than about 30% of a number of the plurality of first trace lines partially disposed in the line overlap area.

7. The display device of claim 5, wherein the plurality of second sensing electrodes comprise a plurality of unit sensing electrodes arranged along the first direction to which the plurality of second trace lines are connected, and
respective widths of the plurality of unit sensing electrodes in the second direction are substantially identical.

8. The display device of claim 7, wherein a cutting part is defined between the dummy electrode unit and the plurality of unit sensing electrodes.

9. The display device of claim 7, wherein the plurality of second sensing electrodes further comprise a plurality of main sensing electrodes spaced apart from the plurality of unit sensing electrodes along the second direction, and
a width of each of the plurality of main sensing electrodes in the second direction is larger than the respective widths of each of the plurality of unit sensing electrodes in the second direction.

10. The display device of claim 1, wherein the plurality of sensing electrodes and the dummy electrode unit each comprise a plurality of mesh lines, and
each of the plurality of mesh lines comprises:
a first mesh line extending in a first diagonal direction between the first direction and the second direction; and
a second mesh line extending from the first mesh line in a second diagonal line crossing the first diagonal direction.

11. The display device of claim 10, wherein the first mesh line and the second mesh line cross each other.

12. The display device of claim 1, wherein the input sensing unit comprises:

a first sensing insulation layer directly disposed on the display panel;
a first sensing conductive layer disposed on the first sensing insulation layer;
a second sensing insulation layer disposed on the first sensing insulation layer and covering the first sensing conductive layer;
a second sensing conductive layer disposed on the second sensing insulation layer; and
a third sensing insulation layer disposed on the second sensing insulation layer and covering the second sensing conductive layer.

13. The display device of claim 12, wherein each of the plurality of first sensing electrodes and each of the plurality of first trace lines is disposed on the second sensing insulation layer.

14. The display device of claim 1, wherein the inside portion comprises:
a first portion extending in the first direction; and
a second portion extending in the second direction.

15. The display device of claim 1, wherein the inside portion comprises a plurality of mesh lines comprising:
a first mesh line extending in a first diagonal direction between the first direction and the second direction; and
a second mesh line extending from the first mesh line in a second diagonal direction crossing the first diagonal direction.

16. The display device of claim 15, wherein the plurality of mesh lines further comprise:
a 1a-th line included in an a-th trace line among the plurality of first trace lines; and
a 2a-th line included in the a-th trace line, and spaced apart from the 1a-th line along the first direction and the second direction,
wherein the 1a-th line is electrically connected to the 2a-th line through a connection part.

17. A display device, comprising:
a display panel divided into a display area and a non-display area; and
an input sensing unit disposed on the display panel and divided into an active area overlapping the display area and a non-active area overlapping the non-display area,
wherein the input sensing unit comprises:
a plurality of first sensing electrodes overlapping the active area and extending in a first direction;
a plurality of second sensing electrodes overlapping the active area and extending in a second direction crossing the first direction;
a plurality of first trace lines respectively connected to the plurality of first sensing electrodes and comprising an inside portion at least partially overlapping the active area;
a plurality of second trace lines respectively connected to the plurality of second sensing electrodes and at least partially overlapping the active area; and
a dummy electrode unit overlapping the inside portion and a portion of the plurality of second trace lines in the first direction, and spaced apart from the plurality of first sensing electrodes and the plurality of second sensing electrodes along the second direction,
wherein the dummy electrode unit and the inside portion are disposed in a line overlap area of the active area, the line overlap area is disposed at a boundary of the active area and the non-active area, and the dummy electrode unit does not extend outside of the line overlap area.

18. The display device of claim 17, wherein the active area comprises:

a main area disposed with the plurality of first sensing electrodes and the plurality of second sensing electrodes; and a dummy area disposed with the dummy electrode unit, wherein the dummy area overlaps the line overlap area in the first direction, and overlaps the main area in the second direction.

19. The display device of claim 17, wherein the plurality of second sensing electrodes comprise a plurality of unit sensing electrodes arranged along the first direction to which the plurality of second trace lines are connected, and respective widths of the plurality of unit sensing electrodes in the second direction are substantially identical.

20. A display device, comprising:

a display panel divided into a display area and a non-display area; and an input sensing unit disposed on the display panel and divided into an active area overlapping the display area and a non-active area overlapping the non-display area, wherein the input sensing unit comprises:

a plurality of first sensing electrodes overlapping the active area and extending in a first direction;

a plurality of second sensing electrodes overlapping the active area and extending in a second direction crossing the first direction;

a plurality of first trace lines respectively connected to the plurality of first sensing electrodes;

a plurality of second trace lines respectively connected to the plurality of second sensing electrodes; and a dummy electrode unit spaced apart from the plurality of first sensing electrodes and the plurality of second sensing electrodes along the second direction, wherein the plurality of second sensing electrodes comprise a plurality of unit sensing electrodes connected to the plurality of second trace lines, adjacent to the dummy electrode unit, and arranged along the first direction, respective widths of the plurality of unit sensing electrodes in the second direction are substantially identical, and the dummy electrode unit is disposed in a line overlap area of the active area, the line overlap area is disposed at a boundary of the active area and the non-active area, and the dummy electrode unit does not extend outside of the line overlap area.

* * * * *